(12) United States Patent
Amin et al.

(10) Patent No.: US 12,334,160 B2
(45) Date of Patent: Jun. 17, 2025

(54) APPARATUS AND METHOD FOR DETECTING NEIGHBOR PLANE ERASE FAILURES

(71) Applicant: SanDisk Technologies LLC, Addison, TX (US)

(72) Inventors: Parth Amin, Livermore, CA (US); Anubhav Khandelwal, San Jose, CA (US); Deepanshu Dutta, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 210 days.

(21) Appl. No.: 18/355,348

(22) Filed: Jul. 19, 2023

(65) Prior Publication Data

US 2024/0212764 A1    Jun. 27, 2024

Related U.S. Application Data

(60) Provisional application No. 63/434,793, filed on Dec. 22, 2022.

(51) Int. Cl.
| | | |
|---|---|---|
| *G11C 16/14* | (2006.01) | |
| *G11C 16/34* | (2006.01) | |
| *G11C 16/04* | (2006.01) | |
| *G11C 16/16* | (2006.01) | |

(52) U.S. Cl.
CPC .......... *G11C 16/3445* (2013.01); *G11C 16/14* (2013.01); *G11C 16/0483* (2013.01); *G11C 16/16* (2013.01)

(58) Field of Classification Search
CPC ..... G11C 16/0483; G11C 16/14; G11C 16/16; G11C 16/3445
USPC ................................................... 365/185.22
See application file for complete search history.

(56) References Cited

U.S. PATENT DOCUMENTS

| | | | |
|---|---|---|---|
| 9,449,698 B1 | 9/2016 | Paudel et al. | |
| 10,943,662 B1* | 3/2021 | Linnen .................. | G11C 16/08 |
| 12,147,695 B2* | 11/2024 | Liu ....................... | G06F 3/0619 |
| 2009/0296492 A1 | 12/2009 | Chen | |
| 2010/0110796 A1 | 5/2010 | Park et al. | |
| 2016/0055918 A1 | 2/2016 | Kochar et al. | |
| 2020/0402582 A1* | 12/2020 | Yang ..................... | G06F 3/0679 |
| 2022/0101926 A1 | 3/2022 | Oowada et al. | |

* cited by examiner

*Primary Examiner* — Ly D Pham
(74) *Attorney, Agent, or Firm* — PEARL COHEN ZEDEK LATZER BARATZ LLP

(57) ABSTRACT

An apparatus is provided that includes a control circuit coupled to a plurality of non-volatile memory cells disposed in a plurality of planes. The control circuit is configured to concurrently erase a block of memory cells in each of the plurality of planes, determine that the concurrent erase failed, disconnect a first one of the planes from the plurality of planes to form first remaining planes, and concurrently erase a block of memory cells in each of the first remaining planes.

20 Claims, 17 Drawing Sheets

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

Fig. 7A number of cells

E $V_T$

Fig. 7B number of cells

E    IM

VvIM $V_T$

Fig. 7C number of cells

E    IM

S0  S1  S2  S3  S4  S5  S6  S7
   Vv1' Vv2' Vv3' Vv4' Vv5' Vv6' Vv7'

$V_T$

Fig. 7D number of cells

S0   S1  S2  S3  S4  S5  S6  S7
    Vv1 Vv2 Vv3 Vv4 Vv5 Vv6 Vv7

$V_T$

Fig. 7E number of cells

S0   S1  S2  S3  S4  S5  S6  S7

$V_T$

APPARATUS AND METHOD FOR DETECTING NEIGHBOR PLANE ERASE FAILURES

CLAIM OF PRIORITY

The present application claims priority from U.S. Provisional Patent Application No. 63/434,793, entitled "APPARATUS AND METHOD FOR DETECTING NEIGHBOR PLANE ERASE FAILURES," filed Dec. 22, 2022, which is incorporated by reference herein in its entirety.

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). However, various challenges are presented in operating such memory systems. In particular, as memory cells decrease in size and memory arrays increase in density, maintaining the integrity of data being stored becomes more challenging.

BRIEF DESCRIPTION OF THE DRAWINGS

Like-numbered elements refer to common components in the different figures.

FIGS. 7A-7E depict various threshold voltage distributions and describe a process for programming non-volatile memory.

DETAILED DESCRIPTION

Figure 1:
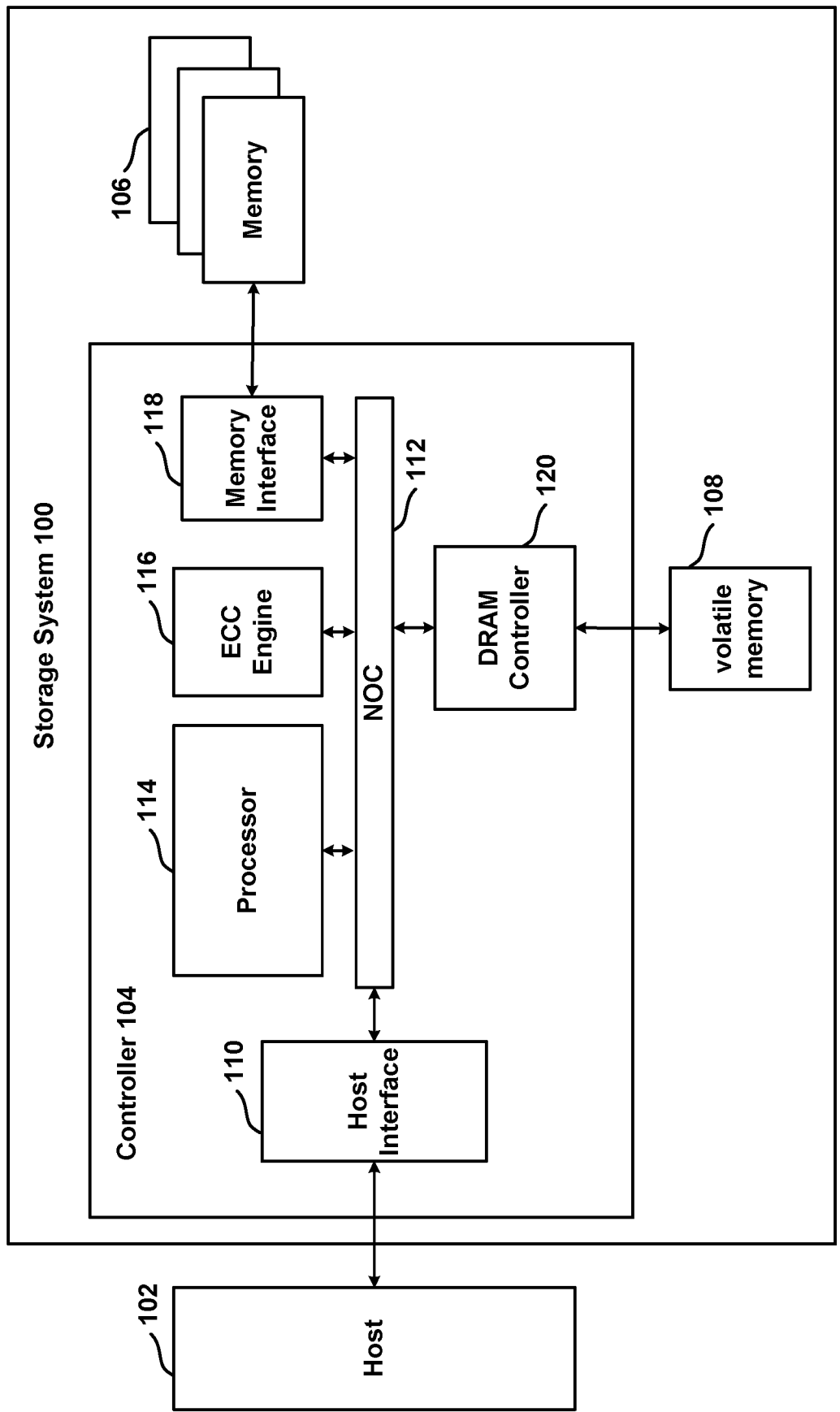
FIG. 1 is a block diagram depicting one embodiment of a memory system.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data are binary data.

In contrast, a multi-state flash memory cell (storing multi-state data) is implemented by identifying multiple, distinct allowed threshold voltage ranges. Each distinct threshold voltage range corresponds to a predetermined value for the set of data bits. For example, some memory cells can store two or more bits. The specific relationship between the data programmed into the memory cell and the threshold voltage ranges of the memory cell depends upon the data encoding scheme adopted for the memory cells.

In addition to the gains in capacity resulting from multi-state memory architectures, significant advantages in memory technology have resulted from steadily scaling down the physical dimensions of memory cells. Smaller memory cells can be packed more densely on a given die area, allowing higher memory capacity for the same price as an older memory technology. However, scaling the sizes of memory cells entails certain risks.

Indeed, densely packing such smaller memory cells may result in increased manufacturing defects, such as shorting between adjacent word lines, shorting between word lines and interconnects, shorting between word lines and the substrate, and broken word lines. Such manufacturing defects often result in corruption of data stored on the word lines being programmed and nearby word lines.

In some cases, these manufacturing defects are not realized during tests conducted during manufacturing and prior to packaging and shipping the memory devices. Instead, such latent manufacturing defects may only begin to corrupt data after an end user begins programing and erasing the memory cells in such memory devices.

Some memory technologies seek to combat latent manufacturing defects by reading programmed data after programming or evaluating performance after completing programming. However, by the time programming has completed, the programming process may have already damaged data stored in other nearby memory cells.

In addition, some non-volatile memory devices include a multi-plane memory structure organization, and memory cells in the multiple planes connected to the same word lines may be concurrently erased. Although multi-plane erasing may increase erase speed, any defects such as the word line defects described above on one plane may disturb erasing of memory cells on the concurrently erased planes.

Technology is described that may decrease time required to perform a multi-plane erase. In an embodiment, a multi-plane erase is performed to concurrently erase multiple planes. In an embodiment, if the multi-plane erase fails, individual planes are successively disconnected from the other planes, and a multi-plane erase is performed on the remaining connected planes. In an embodiment, this successive process continues until a multi-plane erase passes.

FIG. 1 is a block diagram of an embodiment of a memory system 100 that implements the described technology. In an embodiment, memory system 100 is a solid state drive ("SSD"). Memory system 100 also can be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 104 connected to one or more memory die 106 and local high speed volatile memory 108 (e.g., DRAM). The one or more memory die 106 each include a plurality of non-volatile memory cells. More information about the structure of each memory die 106 is provided below. Local high speed volatile memory 108 is used by controller 104 to perform certain functions. For example, local high speed volatile memory 108 stores logical to physical address translation tables ("L2P tables")

Controller 104 includes a host interface 110 that is connected to and in communication with host 102. In one embodiment, host interface 110 provides a PCIe interface. Other interfaces can also be used, such as SCSI, SATA, etc. Host interface 110 is also connected to a network-on-chip (NOC) 112, which is a communication subsystem on an integrated circuit. In other embodiments, NOC 112 can be replaced by a bus.

A NOC can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. In embodiments, the wires and the links of a NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges).

Connected to and in communication with NOC 112 is processor 114, ECC engine 116, memory interface 118, and DRAM controller 120. DRAM controller 120 is used to operate and communicate with local high speed volatile memory 108 (e.g., DRAM). In other embodiments, local high speed volatile memory 108 can be SRAM or another type of volatile memory.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Processor 114 performs the various controller memory operations, such as programming, erasing, reading, as well as memory management processes. In an embodiment, processor 114 is programmed by firmware. In other embodiments, processor 114 is a custom and dedicated hardware circuit without any software. In an embodiment, processor 114 also implements a translation module, as a software/firmware process or as a dedicated hardware circuit.

In many systems, non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies.

One example implementation is to maintain tables (e.g., the L2P tables mentioned above) that identify a translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that local memory 108 cannot hold all of the L2P tables. In such a case, the entire set of L2P tables are stored in a memory die 106 and a subset of the L2P tables are cached (L2P cache) in the local high speed volatile memory 108.

In an embodiment, memory interface 118 communicates with one or more memory die 106. In an embodiment, memory interface 118 provides a Toggle Mode interface. Other interfaces also can be used. In some example implementations, memory interface 118 (or another portion of controller 104) implements a scheduler and buffer for transmitting data to and receiving data from one or more memory die.

Figure 2:
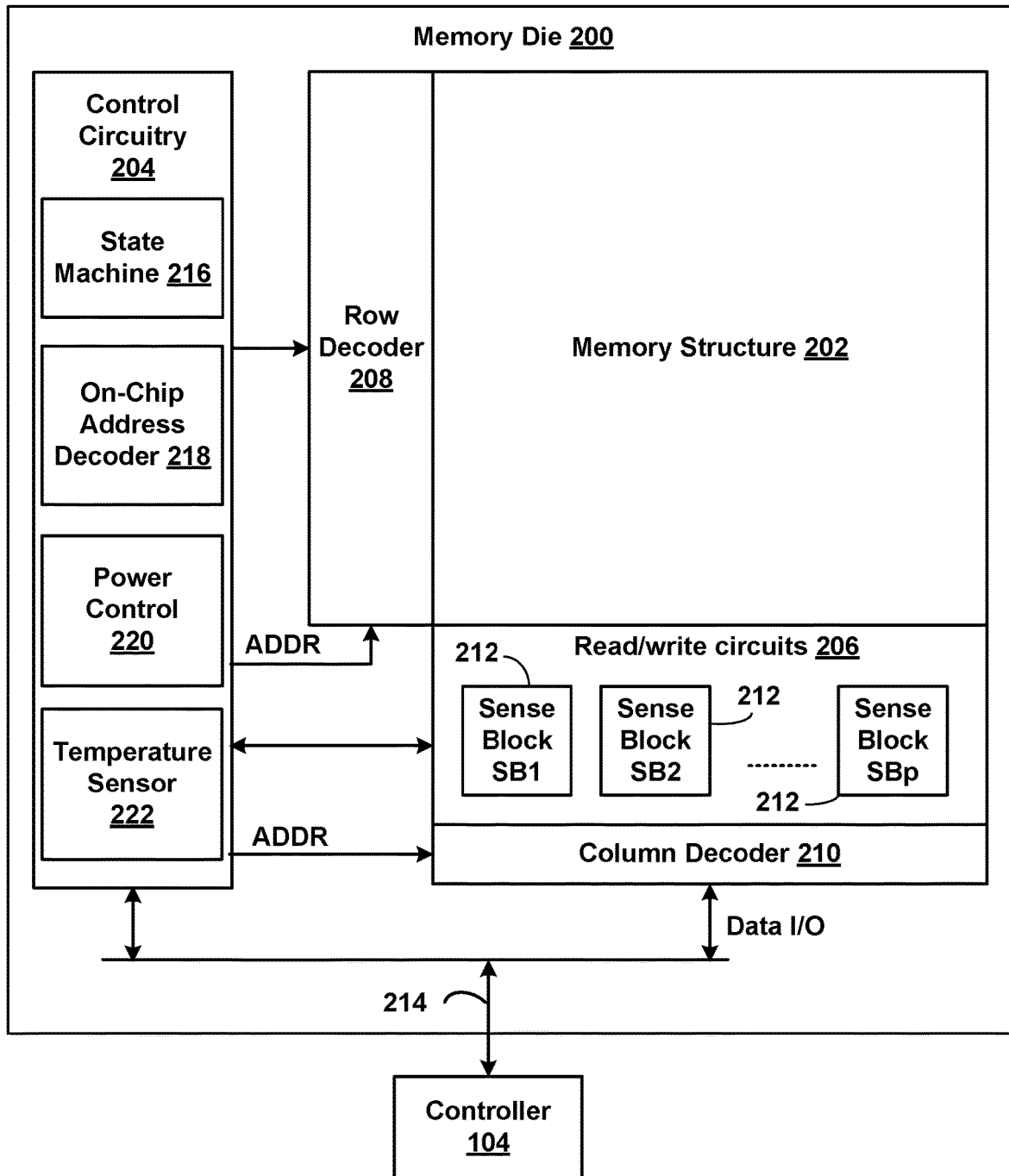
FIG. 2 is a block diagram of one embodiment of a memory die.

FIG. 2 is a functional block diagram of one embodiment of a memory die 200. Each of the one or more memory die 106 of FIG. 1 can be implemented as memory die 200 of FIG. 2. The components depicted in FIG. 2 are electrical circuits. In an embodiment, each memory die 200 includes a memory structure 202, control circuitry 204, and read/write circuits 206. Memory structure 202 is addressable by word lines via a row decoder 208 and by bit lines via a column decoder 210.

In an embodiment, read/write circuits 206 include multiple sense blocks 212 including SB1, SB2, . . . . SBp (sensing circuitry) and allow a page (or multiple pages) of data in multiple memory cells to be read or programmed (written) in parallel. In an embodiment, each sense block 212 include a sense amplifier and a set of latches connected to the bit line. The latches store data to be written and/or data that has been read. In an embodiment, each sense amplifier 212 includes bit line drivers. In an embodiment, commands and data are transferred between controller 104 and memory die 200 via lines 214. In an embodiment, memory die 200 includes a set of input and/or output (I/O) pins that connect to lines 214.

In an embodiment, control circuitry 204 cooperates with read/write circuits 206 to perform memory operations (e.g., write, read, erase, and others) on memory structure 202. In an embodiment, control circuitry 204 includes a state machine 216, an on-chip address decoder 218, a power control circuit 220, and a temperature sensor 222 circuit. In an embodiment, state machine 216 provides die-level control of memory operations. In an embodiment, state machine 216 is programmable by software. In other embodiments, state machine 216 does not use software and is completely implemented in hardware (e.g., electrical circuits). In some embodiments, state machine 216 can be replaced by a microcontroller or microprocessor. In an embodiment, control circuitry 204 includes buffers such as registers, ROM fuses and other storage devices for storing default values such as base voltages and other parameters. In an embodiment, temperature sensor circuit 222 detects a die temperature at memory die 200.

On-chip address decoder 218 provides an address interface between addresses used by controller 104 to the hardware address used by row decoder 208 and column decoder 210. Power control module 220 controls the power and voltages supplied to the word lines and bit lines during memory operations. Power control module 220 may include charge pumps for creating voltages.

For purposes of this document, control circuitry 204, read/write circuits 206, row decoder 208 and column decoder 210 comprise a control circuit for memory structure 202. In other embodiments, other circuits that support and operate on memory structure 202 can be referred to as a control circuit. For example, in some embodiments, controller 104 can operate as the control circuit or can be part of the control circuit. The control circuit also can be implemented as a microprocessor or other type of processor that is hardwired or programmed to perform the functions described herein.

For purposes of this document, control circuitry 204, read/write circuits 206, row decoder 208 and column decoder 210 comprise peripheral circuits for memory structure 202, as they are not part of memory structure 202 but are on the same die as memory structure 202 and are used to operate memory structure 202.

In an embodiment, memory structure 202 is a three dimensional memory array of non-volatile memory cells. In an embodiment, memory structure 202 is a monolithic three dimensional memory array in which multiple memory levels are formed above a single substrate, such as a wafer. The memory structure may be any type of non-volatile memory that is formed in one or more physical levels of arrays of memory cells having an active area disposed above a silicon (or other type of) substrate. In one example, the non-volatile memory cells of memory structure 202 include vertical NAND strings with charge-trapping material such as described. A NAND string includes memory cells connected by a channel.

In another embodiment, memory structure 202 includes a two dimensional memory array of non-volatile memory cells. In an example, the non-volatile memory cells are NAND flash memory cells utilizing floating gates. Other types of memory cells (e.g., NOR-type flash memory) also can be used.

The exact type of memory array architecture or memory cell included in memory structure 202 is not limited to the examples above. Many different types of memory array architectures or memory cell technologies can be used to form memory structure 202. No particular non-volatile memory technology is required for purposes of the new technology described herein.

Other examples of suitable technologies for memory cells of the memory structure 202 include ReRAM memories, magnetoresistive memory (MRAM), phase change memory (PCM), and the like. Examples of suitable technologies for architectures of memory structure 202 include two dimensional arrays, three dimensional arrays, cross-point arrays, stacked two dimensional arrays, vertical bit line arrays, and the like.

One example of a cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell.

A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of solid electrolyte between the two electrodes.

MRAM stores data using magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the coordination state of Germanium atoms with a laser pulse (or light pulse from another source). Therefore, the doses of programming are laser pulses. The memory cells can be inhibited from programming by blocking the memory cells from receiving the light.

A person of ordinary skill in the art will recognize that the technology described herein is not limited to a single specific memory structure, but covers many relevant memory structures within the scope of the technology as described herein and as understood by one of ordinary skill in the art.

Figure 3:
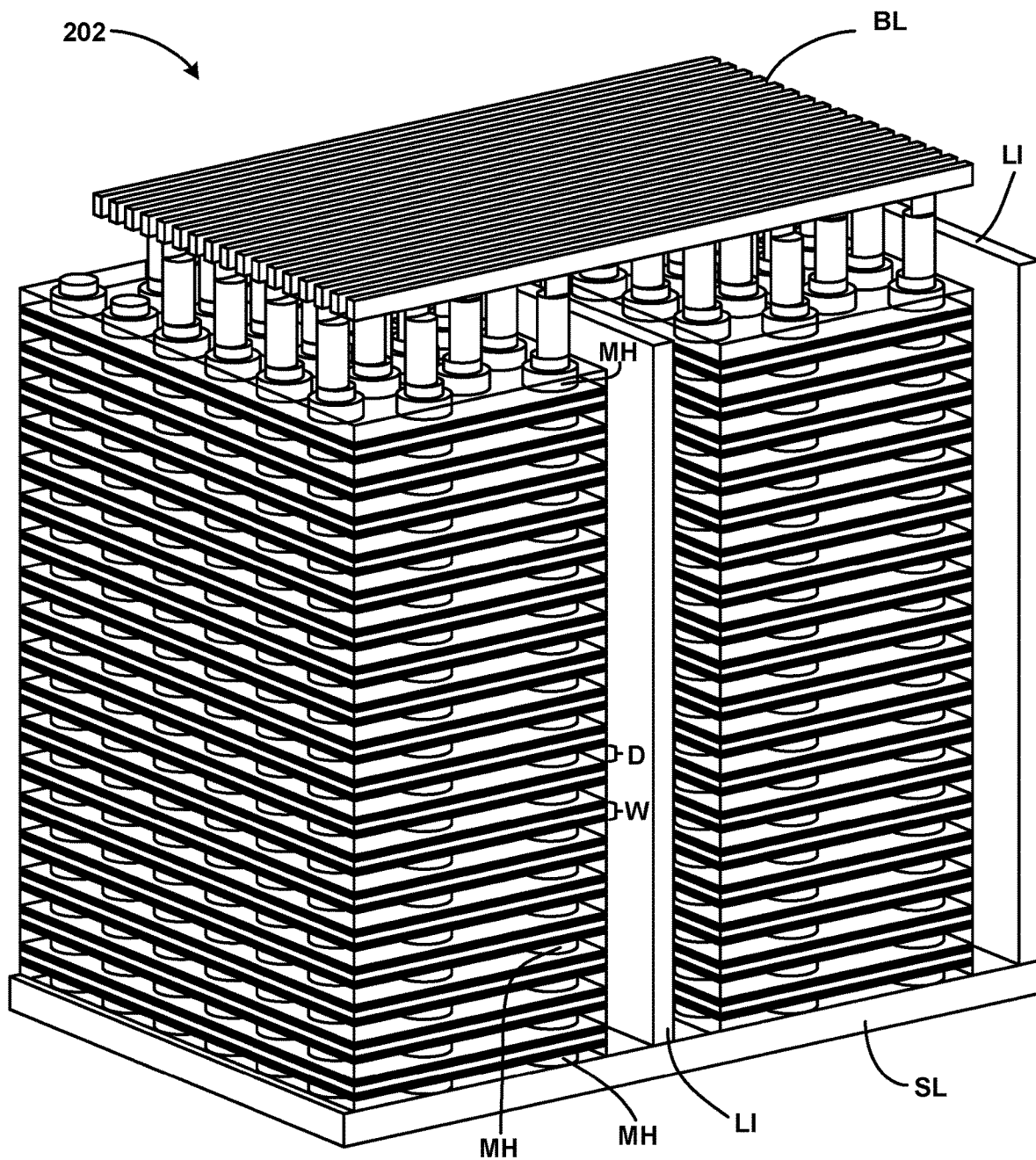
FIG. 3 is a perspective view of a portion of one embodiment of a three dimensional memory structure.

FIG. 3 is a perspective view of a portion of an embodiment of a three dimensional memory array that includes memory structure 202. In an embodiment, memory structure 202 includes multiple non-volatile memory cells. For example, FIG. 3 shows a portion of one block of memory cells. The structure depicted includes a set of bit lines BL positioned above a stack of alternating dielectric layers and conductive layers. For example purposes, one of the dielectric layers is marked as D and one of the conductive layers (also called word line layers) is marked as W.

The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers also can be used. In an embodiment, the alternating dielectric layers and conductive layers are divided into four regions by local interconnects LI. FIG. 3 shows two regions and two local interconnects LI.

A source line layer SL is below the alternating dielectric layers and word line layers. Memory holes are formed in the stack of alternating dielectric layers and conductive layers. For example, one of the memory holes is marked as MH. Note that in FIG. 3 the dielectric layers are depicted as see-through so that the reader can see the memory holes positioned in the stack of alternating dielectric layers and conductive layers.

In an embodiment, NAND strings are formed by filling the memory hole with materials including a charge-trapping material to create a vertical column of memory cells (also referred to as a memory column). In an embodiment, each memory cell can store one or more bits of data. In an embodiment, each memory hole MH is associated with and coupled to a corresponding one of bit lines BL. In an embodiment, each bit line BL is coupled to one or more memory holes MH. More details of a three dimensional memory array that comprises memory structure 202 is provided below with respect to FIG. 4A-4F.

Figure 4A:
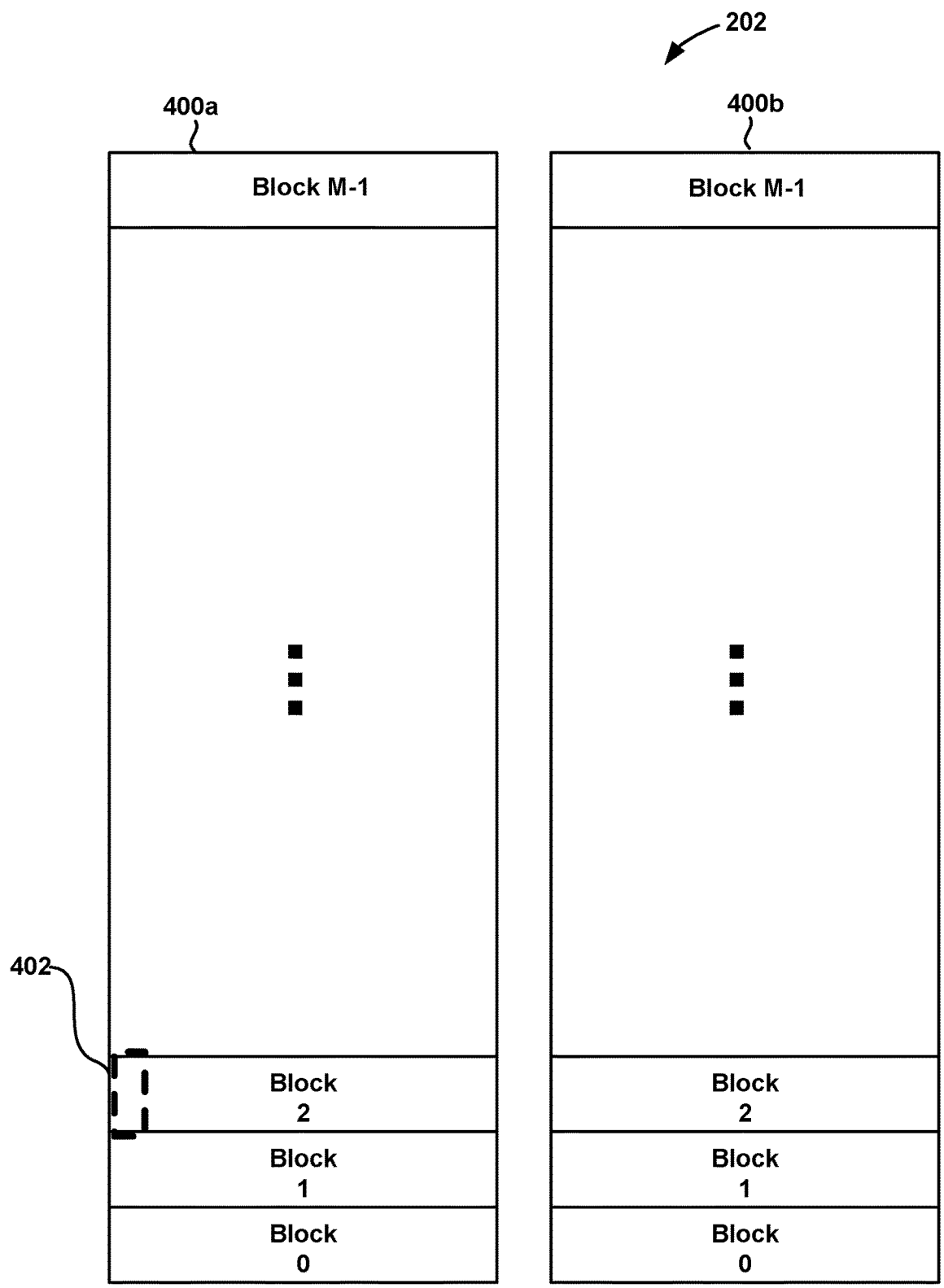
FIG. 4A is a block diagram of a memory structure having two planes.

FIG. 4A is a block diagram explaining one example organization of memory structure 202, which is divided into two planes 400a and 400b. Both planes are on the same memory die 200 (FIG. 2). Each plane is then divided into M blocks. In one example, each plane has about 2000 blocks. However, different numbers of blocks and planes also can be used. A portion 402 of block 2 of memory plane 400a is shown in dashed line in FIG. 4A.

In an embodiment, a block of memory cells is a unit of erase. That is, all memory cells of a block are erased together. In other embodiments, memory cells can be grouped into blocks for other reasons, such as to organize memory structure 202 to enable the signaling and selection circuits. In some embodiments, a block represents a group of connected memory cells as the memory cells of a block share a common set of word lines. Although FIG. 4A shows two planes on the same die, in other embodiments more than two planes can be implemented. For example, memory structure 202 can include 2-8 (or more) planes.

Figure 4B:
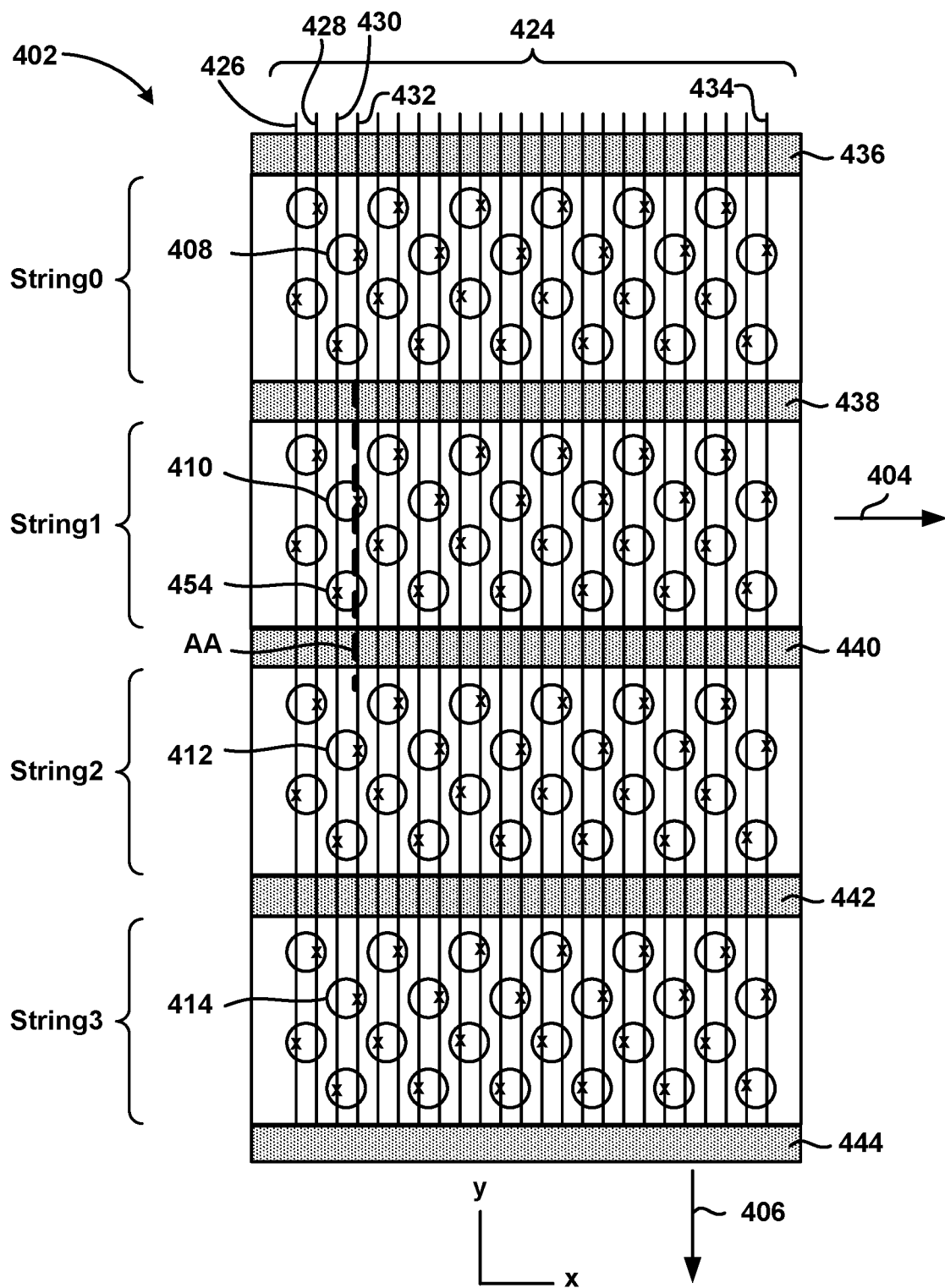
FIG. 4B depicts a top view of a portion of a block of memory cells.

FIGS. 4B-4F depict an example three dimensional ("3D") NAND structure that corresponds to the structure of FIG. 3. FIG. 4B is a block diagram depicting a top view of portion 402 (FIG. 4A) of memory structure 202. As can be seen from FIG. 4B, portion 402 extends in direction 404 and direction 406. In an embodiment, the memory array has many layers, however, FIG. 4B only shows the top layer.

FIG. 4B depicts a plurality of circles that represent the memory holes, which are also referred to as memory columns. For example, FIG. 4B depicts memory holes 408, 410, 412 and 414. Each of the memory holes include multiple select transistors (also referred to as a select gate or selection gate) and multiple memory cells. In an embodiment, each memory hole implements a NAND string. Because portion 402 extends in directions 404 and 406, the block includes more memory holes than depicted in FIG. 4B.

FIG. 4B also depicts a set of bit lines 424, including bit lines 426, 428, 430, 432, . . . 434. In an embodiment, each memory hole is associated with and coupled to a corresponding one of the bit lines. In an embodiment, each bit line is coupled to one or more memory holes. FIG. 4B shows twenty four bit lines because only a portion of the block is depicted. It is contemplated that more than twenty four bit lines are connected to memory holes of the block. Each of the circles representing a memory hole has an "x" to indicate its connection to one bit line. For example, bit line 432 is connected to memory holes 408, 410, 412 and 414.

Portion 402 depicted in FIG. 4B includes a set of local interconnects 436, 438, 440, 442 and 444 that connect the various layers to a source line below the memory holes. Local interconnects 436, 438, 440, 442 and 444 also serve to divide each layer of the block into four regions. For example, the top layer depicted in FIG. 4B is divided into four regions designated as String0, String1, String2 and String3. In the layers of the block that implement memory cells, String0, String1, String2 and String3 also may be referred to as word line fingers that are separated by the local interconnects.

In an embodiment, the word line fingers on a common level of a block connect together to form a single word line. In another embodiment, the word line fingers on the same level are not connected together. In an example implementation, a bit line connects to a single memory hole in each of String0, String1, String2 and String3. In that implementation, each block has sixteen rows of active columns and each bit line connects to four rows in each block.

In an embodiment, all four rows connected to a common bit line are connected to the same word line (via different word line fingers on the same level that are connected together). Therefore, the system uses the source side selection lines and the drain side selection lines to choose one (or another subset) of the four to be subjected to a memory operation (program, verify, read, and/or erase).

Although FIG. 4B shows four regions String0, String1, String2 and String3, each having four rows of memory holes, and sixteen rows of memory holes in a block, those exact numbers are an example implementation. Other embodiments may include more or less regions per block, more or less rows of memory holes per region and more or less rows of memory holes per block. FIG. 4B also shows the memory holes being staggered. In other embodiments, different patterns of staggering can be used. In some embodiments, the memory holes are not staggered.

Figure 4C:
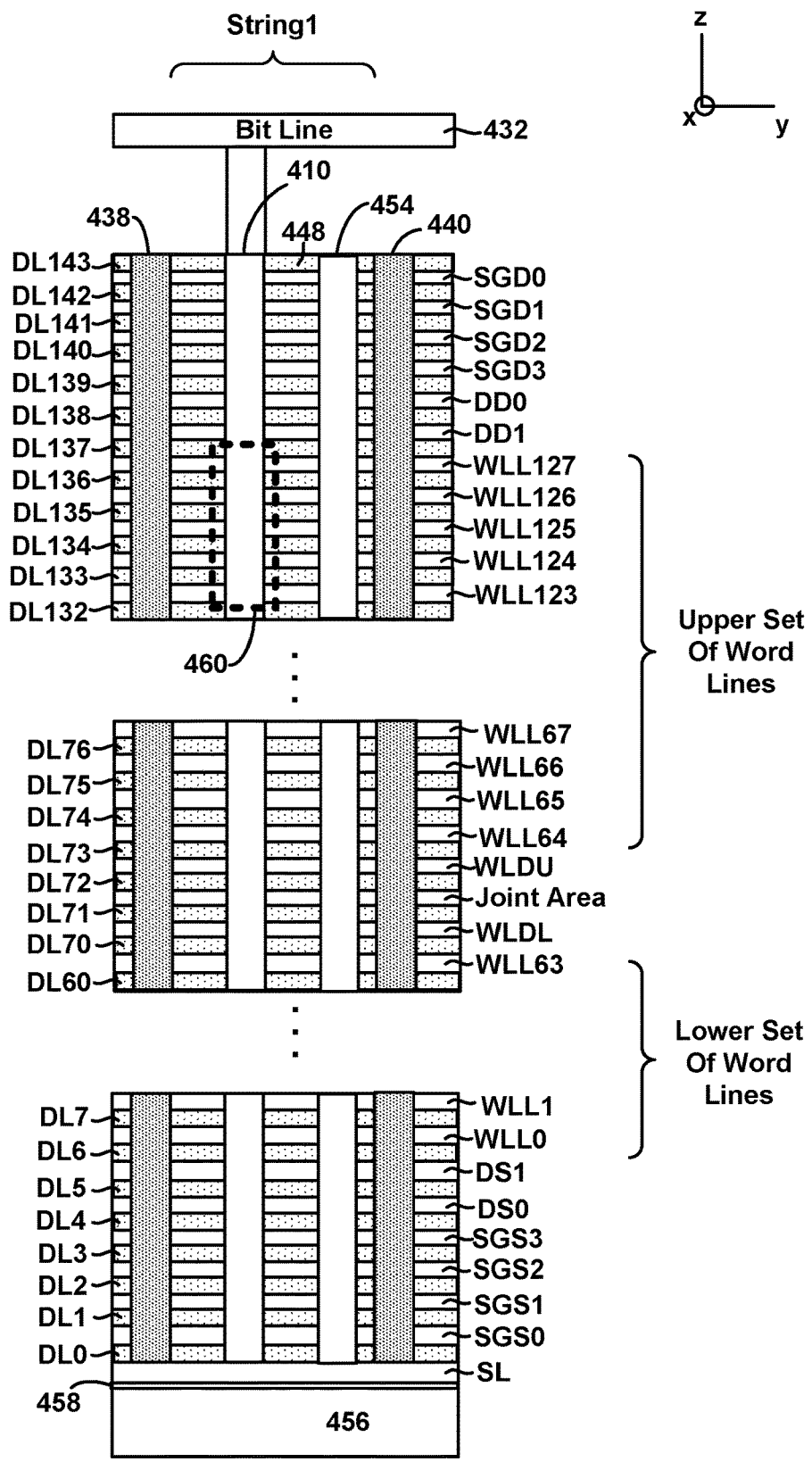
FIG. 4C depicts a cross sectional view of a portion of a block of memory cells.

FIG. 4C depicts a portion of one embodiment of a three dimensional memory structure 202 showing a cross-sectional view along line AA of FIG. 4B. This cross sectional view cuts through memory holes 410 and 454 of String1 (see FIG. 4B). The structure of FIG. 4C includes four drain side select layers SGD0, SGD1, SGD2 and SGD3, four source side select layers SGS0, SGS1, SGS2 and SGS3, six dummy word line layers DD0, DD1, DS0, DS1, WLDL, WLDU, and one hundred and twenty eight data word line layers WLL0-WLL127 for connecting to memory cells. Other embodiments can implement more or less than four drain side select layers, more or less than four source side select layers, more or less than six dummy word line layers, and more or less than one hundred and twenty eight word lines.

Memory holes 410 and 454 are depicted protruding through the drain side select layers, source side select layers, dummy word line layers and word line layers. In one embodiment, each memory hole includes a vertical NAND string. Below the memory holes and the layers listed below is substrate 456, an insulating film 458 on the substrate, and source line SL. The NAND string of memory hole 410 has a source end at a bottom of the stack and a drain end at a top of the stack. As in agreement with FIG. 4B, FIG. 4C shows memory hole 410 connected to bit line 432 via connector 460. Local interconnects 438 and 440 also are depicted.

For ease of reference, drain side select layers SGD0, SGD1, SGD2 and SGD3, source side select layers SGS0, SGS1, SGS2 and SGS3, dummy word line layers DD0, DD1, DS0, DS1, WLDL and WLDU, and word line layers WLL0-WLL127 collectively are referred to as the conductive layers. In an embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials.

Between conductive layers are dielectric layers DL0-DL143. For example, dielectric layer DL136 is above word line layer WLL126 and below word line layer WLL127. In an embodiment, the dielectric layers are made from $SiO_2$. In other embodiments, other dielectric materials can be used to form the dielectric layers.

The non-volatile memory cells are formed along memory holes which extend through alternating conductive and dielectric layers in the stack. In an embodiment, the memory cells are arranged in NAND strings. The word line layers WLL0-WLL127 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data.

In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a "Joint Area." In an embodiment it is expensive and/or challenging to etch one hundred and twenty-eight word line layers intermixed with dielectric layers. To ease this burden, one embodiment includes laying down a first stack of sixty four word line layers alternating with dielectric layers, laying down the Joint Area, and laying down a second stack of sixty four word line layers alternating with dielectric layers. The Joint Area is positioned between the first stack and the second stack. The Joint Area is used to connect the first stack to the second stack.

In FIG. 4C, the first stack is labeled as the "Lower Set of Word Lines" and the second stack is labeled as the "Upper Set of Word Lines." In an embodiment, the Joint Area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
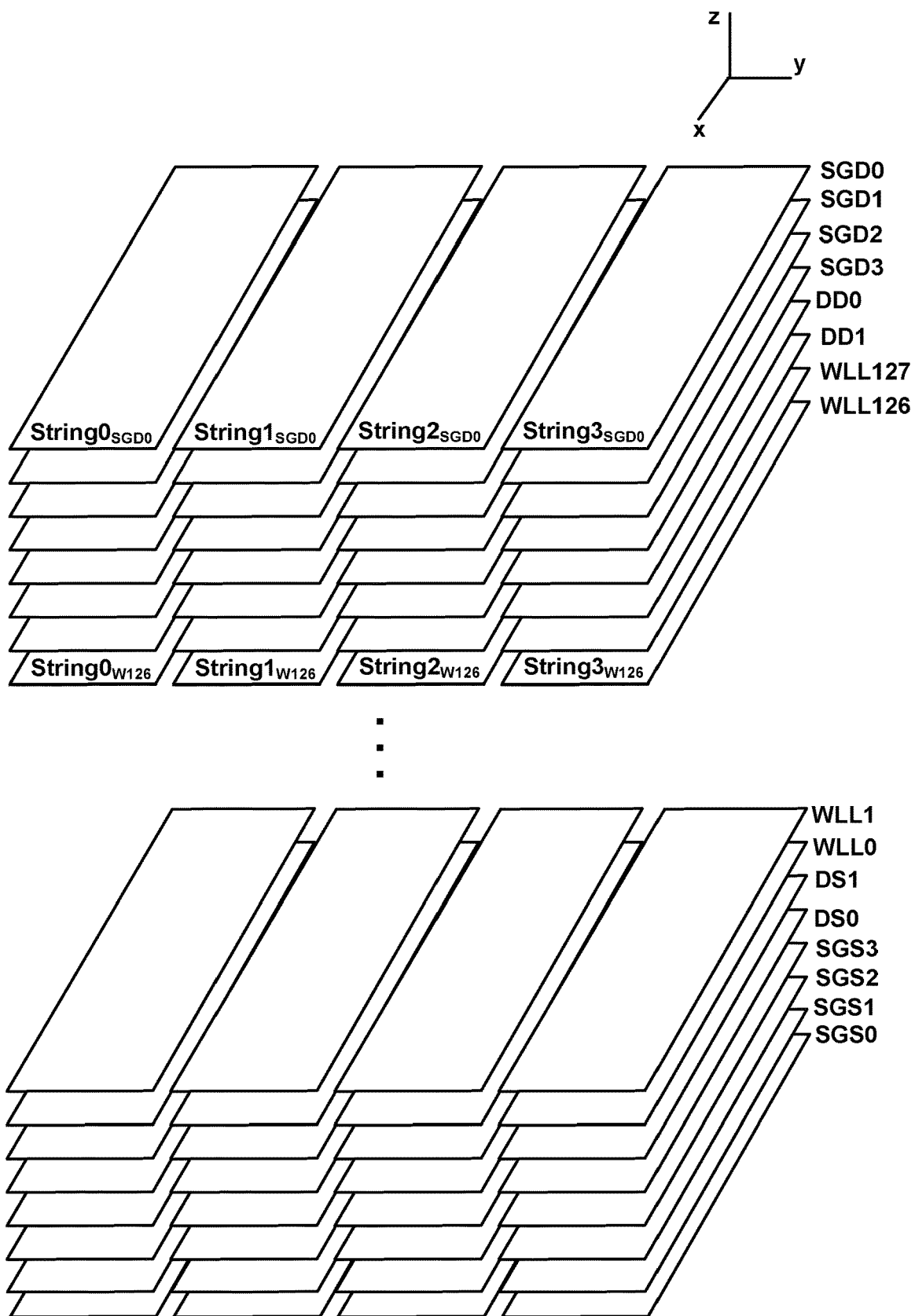
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL127) for the block that is partially depicted in FIG. 4C. As mentioned above with respect to FIG. 4B, in an embodiment local interconnects 436, 438, 440, 442 and 444 break up the conductive layers into four regions/fingers.

For example, word line layer WLL126 is divided into regions $String0_{W126}$, $String1_{W126}$, $String2_{W126}$ and $String3_{W126}$. In an embodiment, the four word line fingers on a same level are connected together. In another embodiment, each word line finger operates as a separate word line.

Likewise, drain side select gate layer SGD0 (the top layer) is divided into regions $String0_{SGD0}$, $String1_{SGD0}$, $String2_{SGD0}$ and $String3_{SGD0}$, also known as fingers or select line fingers. In an embodiment, the four select line fingers on a same level are connected together. In another embodiment, each select line finger operates as a separate word line.

Figure 4E:
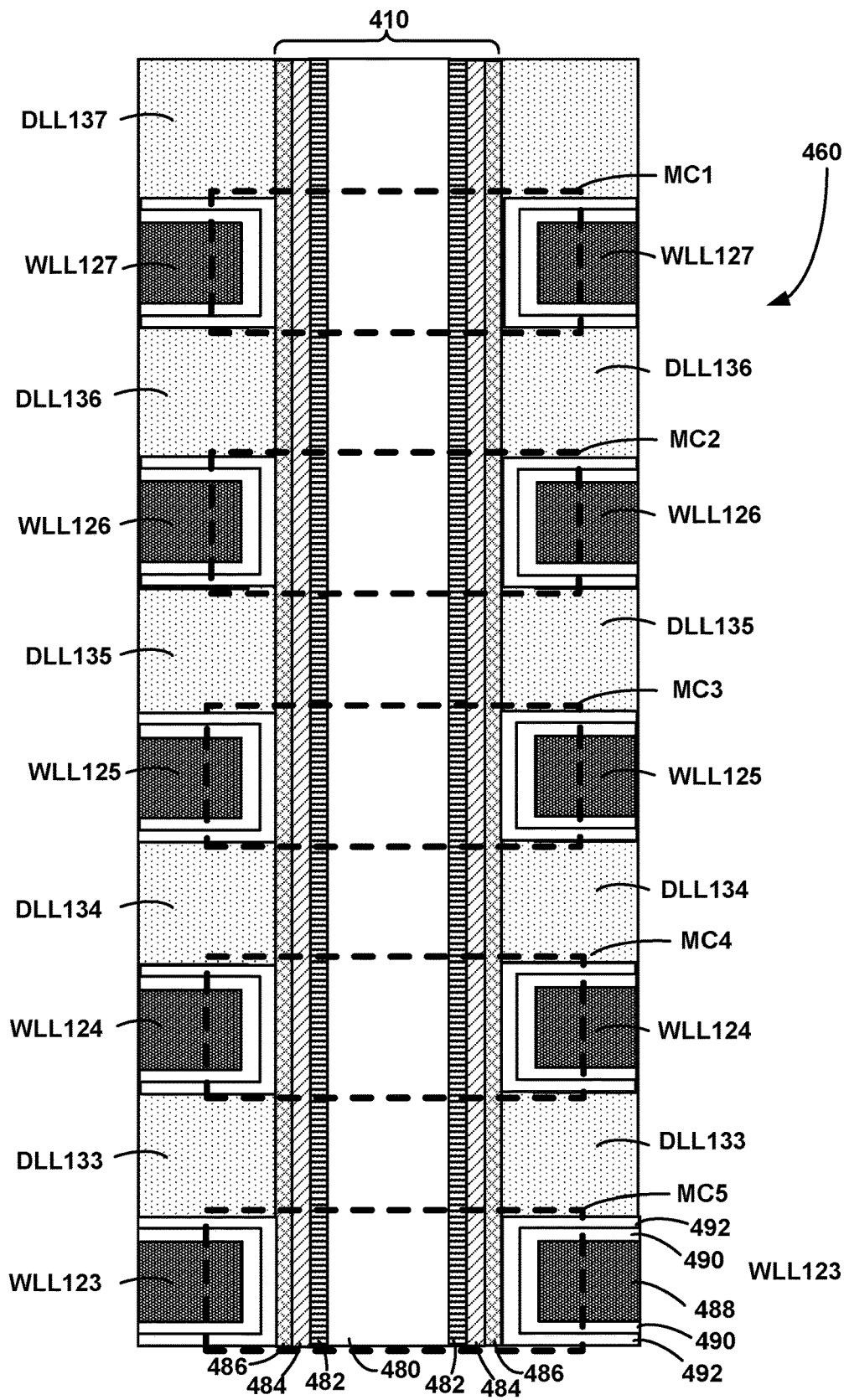
FIG. 4E is a cross sectional view of a memory hole of memory cells.

FIG. 4E depicts a cross sectional view of String1 of FIG. 4C that includes a portion of memory hole 410. In an embodiment, the memory holes (e.g., memory hole 410) are shaped as cylinders. In other embodiment, however, memory holes may have other shapes. In an embodiment, memory hole 410 includes an inner core layer 480, a channel 482 surrounding inner core layer 480, a tunneling dielectric 484 surrounding channel 482, and a charge trapping layer 486 surrounding tunneling dielectric 484. In an embodiment, inner core layer 480 a dielectric material (e.g., $SiO_2$), channel 482 is polysilicon, tunneling dielectric 484 has an ONO structure, and charge trapping layer 486 is silicon nitride. Other memory materials and structures can also be used. The technology described herein is not limited to any particular material or structure.

FIG. 4E depicts dielectric layers DLL137, DLL136, DLL135, DLL134 and DLL133, as well as word line layers WLL127, WLL126, WLL125, WLL124, and WLL123. In an embodiment, each of the word line layers includes a word line region 488 surrounded by an aluminum oxide layer 490, which is surrounded by a blocking oxide ($SiO_2$) layer 492. The physical interaction of the word line layers with the memory hole forms the memory cells. Thus, a memory cell, in an embodiment, includes channel 482, tunneling dielectric 484, charge trapping layer 486, blocking oxide layer 492, aluminum oxide layer 490 and word line region 488.

For example, word line layer WLL127 and a portion of memory hole 410 comprise a memory cell MC1. Word line layer WLL126 and a portion of memory hole 410 comprise a memory cell MC2. Word line layer WLL125 and a portion of memory hole 410 comprise a memory cell MC3. Word line layer WLL124 and a portion of memory hole 410 comprise a memory cell MC4. Word line layer WLL123 and a portion of memory hole 410 comprise a memory cell MC5. In other architectures, a memory cell may have a different structure; however, the memory cell would still be the storage unit.

In an embodiment, when a memory cell is programmed, electrons are stored in a portion of the charge trapping layer 486 which is associated with the memory cell. These electrons are drawn into the charge trapping layer 486 from the channel 482, through the tunneling dielectric 484, in response to an appropriate voltage on word line region 488. The threshold voltage (Vth) of a memory cell is increased in proportion to the amount of stored charge.

In an embodiment, programming a memory cell is achieved through Fowler-Nordheim tunneling of the electrons into charge trapping layer 486. During an erase operation, the electrons return to channel 482 or holes are injected into charge trapping layer 486 to recombine with electrons. In an embodiment, erasing is achieved using hole injection into charge trapping layer 486 via a physical mechanism such as gate induced drain leakage (GIDL).

Figure 4F:
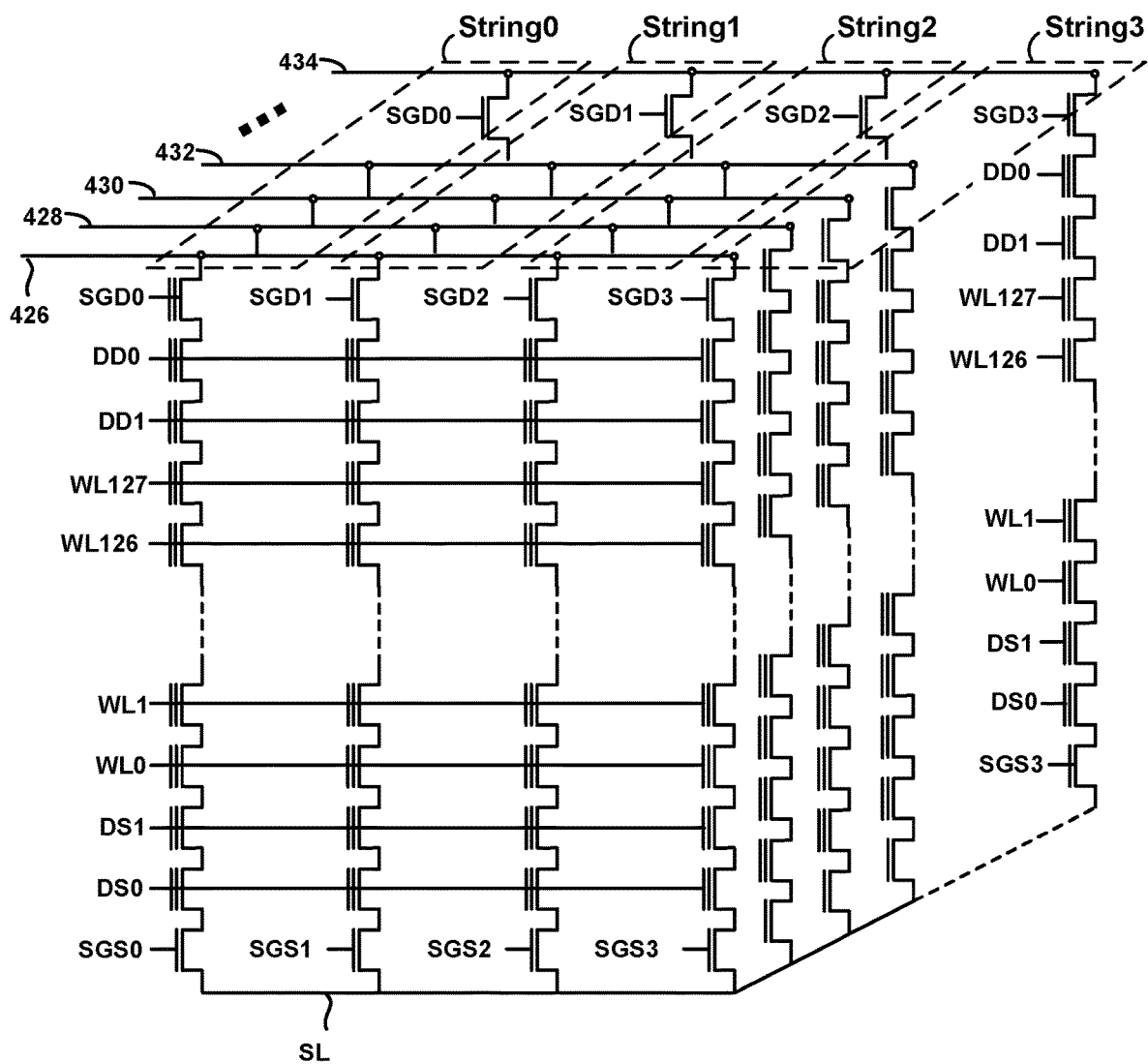
FIG. 4F is a schematic of a plurality of NAND strings.

FIG. 4F is a schematic diagram of corresponding to portion 402 in Block 2 of FIGS. 4A-E, including bit lines 426, 428, 430, 432, . . . 434, and word lines WLL0-WLL127. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

Although the example memory system of FIG. 3 and FIGS. 4A-4F is a three dimensional memory structure that includes vertical NAND strings with charge-trapping material, other (2D and 3D) memory structures also can be used with the technology described herein.

Figures 5, 6:
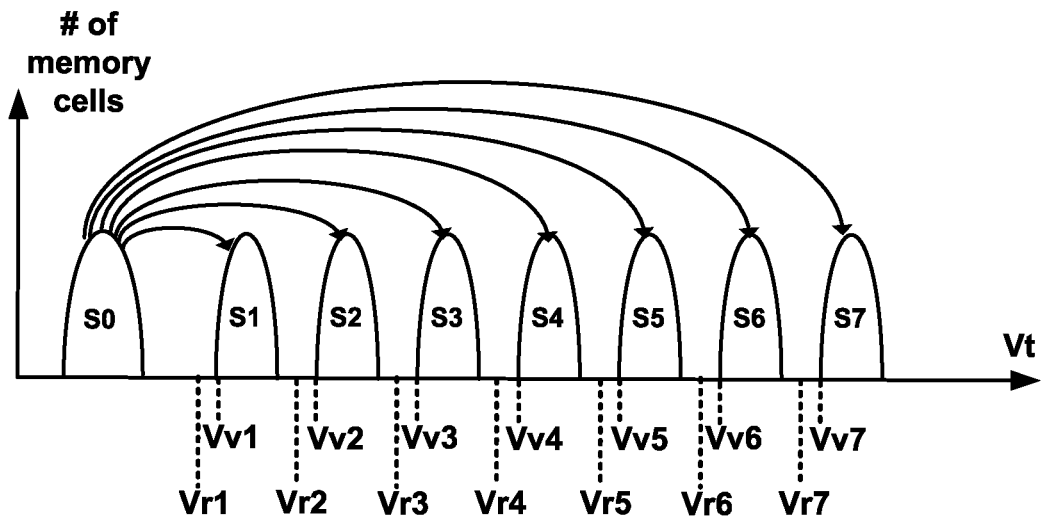
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for a memory array when each memory cell stores three bits of data. Other embodiments, however, may use other data capacities per memory cell (e.g., such as one, two, four, or five bits of data per memory cell).

FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states.

Each threshold voltage distribution (data state) corresponds to predetermined values for the set of data bits. The specific relationship between the data programmed into a memory cell and the threshold voltage levels of the memory cell depends on the data encoding scheme adopted for the cells. In an embodiment, data values are assigned to the threshold voltage ranges using a Gray code assignment so that if the threshold voltage of a memory cell erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (S0, S1, S2, S3, . . . , S7) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In an embodiment, known as full sequence programming, memory cells can be programmed from the erased data state S0 directly to any of the programmed states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent full sequence programming.

The technology described herein also can be used with other types of programming in addition to full sequence programming (including, but not limited to, multiple stage/phase programming). In some embodiments, programmed states S1-S7 can overlap, with controller 104 (FIG. 1) relying on error correction to identify the correct data being stored.

FIG. 6 is a table describing an example assignment of data values to data states. In the table of FIG. 6, S0=111, S1=110, S2=100, S3=000, S4=010, S5=011, S6=001 and S7=101. Other encodings of data also can be used. No particular data encoding is required by the technology disclosed herein. In an embodiment, when a block is subjected to an erase operation, all memory cells are moved to data state S0, the erased state. In the embodiment of FIG. 6, all bits stored in a memory cell are "1" when the memory cell is erased (e.g., in data state S0).

FIGS. 7A-7E illustrate a multi-phase programming approach. In this embodiment, the programming process includes three phases. Prior to programming, the memory cells are erased so that all memory cells connected to a common word line are in an erased threshold voltage distribution E, as depicted in FIG. 7A.

During the first programming phase, those memory cells whose targets (due to the data to be stored in those memory cells) are data states S4, S5, S6 or S7 are programmed to an intermediate threshold voltage distribution IM. Those memory cells are targeted for data states S0, S1, S2 or S3 remain in the erased threshold voltage distribution E. The first phase is graphically depicted in FIG. 7B. Memory cells being programmed to intermediate threshold voltage distribution IM are programmed to a target threshold voltage of VvIM.

During the second programming phase, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0.

Also, during the second programming phase, those memory cells that are in the intermediate state threshold voltage distribution IM are programmed to their target data states. For example, those memory cells to be programmed to data state S7 are programmed from intermediate threshold voltage distribution IM to data state S7, those memory cells to be programmed to data state S6 are programmed from intermediate threshold voltage distribution IM to data state S6, those memory cells to be programmed to data state S5 are programmed from intermediate threshold voltage distribution IM to data state S5, and those memory cells to be in data state S4 are programmed from intermediate threshold voltage distribution IM to data state S4. This second programming phase is illustrated in FIG. 7C.

As can be seen in FIG. 7C, at the end of the second programming phase data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third programming phase, each of data states S1-S7 are tightened so that they no longer overlap with neighboring states. This is depicted graphically by FIG. 7D. The final result of the three phrase programming process is depicted in FIG. 7E, which shows data states S0-S7. In some embodiments, data state S0 is wider than data states S1-S7. In an embodiment, the data states of FIGS. 7A-7E may be encoded according to the table of FIG. 6.

In some embodiments, those memory cells to be programmed to data state S4 are not programmed during the second phase and, therefore, remain in intermediate threshold voltage distribution IM. During the third programming phase, the memory cells are programmed from intermediate threshold voltage distribution IM to S4. In other embodiments, memory cells destined for other states can also remain in intermediate threshold voltage distribution IM or erase threshold voltage distribution E during the second phase.

Figure 8:
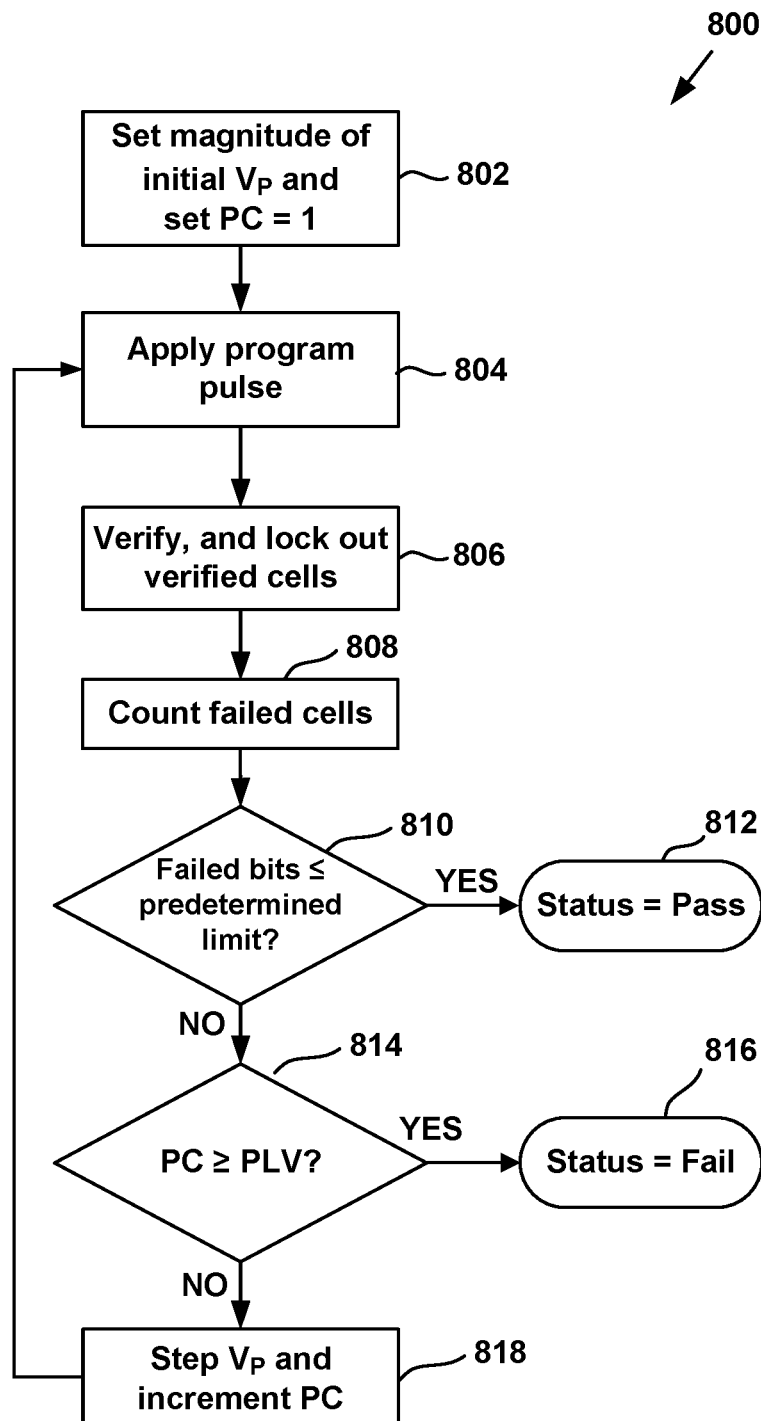
FIG. 8 is a flowchart describing an embodiment of a process for programming non-volatile memory.

FIG. 8 is a flowchart describing an embodiment of a process 800 for programming a memory cell. In an example embodiment, process 800 is performed on memory die 106 (FIG. 1) using the control circuits discussed above. For example, process 800 can be performed at the direction of state machine 216 (FIG. 2). Process 800 also can be used to implement the full sequence programming discussed above. Additionally, process 800 can be used to implement each phase of a multi-phase programming process.

Typically, a program voltage is applied to the control gates (via a selected word line) during a program operation as a series of program pulses. Between programming pulses are a set of verify pulses to perform verification. In many implementations, the magnitude of the program pulses increase with each successive program pulse by a predetermined program step size. In step 802 of process 800, a programming voltage ($V_P$) is initialized to a starting program voltage $V_{Pinit}$ (e.g., between about 12V to about 16V, or some other value) and a program counter PC maintained by state machine 216 is initialized at 1.

In step 804, a program pulse having a magnitude $V_P$ is applied to the selected word line (the word line selected for programming). In an embodiment, the group of memory cells being concurrently programmed are all connected to the same word line (the selected word line). If a memory cell is to be programmed, then the corresponding bit line coupled to the memory cell is grounded. If a memory cell should remain at its current threshold voltage, then the corresponding bit line coupled to the memory cell is connected to Vdd to inhibit programming. In an embodiment, the unselected word lines receive one or more boosting voltages (e.g., between about 7V to about 11V, or some other value) to perform boosting schemes known in the art.

In step 804, the program pulse is applied to all memory cells connected to the selected word line so that all of the connected memory cells are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 806, the memory cells are verified using the appropriate set of verify reference voltages to perform one or more verify operations. In an embodiment, the verification process is performed by testing whether the threshold voltages of the memory cells selected for programming have reached the appropriate verify reference voltage.

In step 808, the memory system counts the number of memory cells that have not yet reached their respective target threshold voltage distribution. That is, the system counts the number of memory cells that have so far failed the verify process. This counting can be done by state machine 216 (FIG. 2), controller 104 (FIG. 1), or other logic. In the remaining discussion, the term "Controller Device" may be one or more of controller 104 of FIG. 1, control circuitry 204 of FIG. 2, state machine 216 of FIG. 2, or other similar controller device.

In an embodiment, each of sense blocks 212 (FIG. 2) stores the status (pass/fail) of their respective memory cells. In an embodiment, one total count reflects the total number of memory cells currently being programmed that have failed the last verify step. In another embodiment, separate counts are kept for each data state.

In step 810, a determination is made whether the count from step 808 is less than or equal to a predetermined limit. In an embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 812. In this situation, enough memory cells programmed correctly such that the few remaining memory cells that have not been completely programmed can be corrected using ECC during the read process.

In some embodiments, the predetermined limit used in step 810 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 814 and the program counter PC is checked against a program limit value (PLV). Examples of program limit values include 6, 12, 16, 20 and 30, although other values can be used. If the program counter PC is greater than or equal to program limit value PLV, then the program process is considered to have failed and a status of FAIL is reported in step 816.

If the program counter PC is not greater than or equal to program limit value PLV, then the process continues at step 818 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value).

Process 800 loops back to step 804 and another program pulse is applied to the selected word line so that another iteration (steps 804-818) of programming process 800 is performed. Each pass through steps 804-818 is referred to herein as a "program loop." The program limit value PLV described above therefore specifies a maximum number of program loops that may be used to program the memory cells coupled to the selected word line. The comparison performed at step 814 is referred to herein as a "maximum program count test."

In general, during verify operations and read operations, the selected word line is connected to a voltage (one example of a reference signal), a level of which is specified for each read operation (e.g., read compare levels Vr1, Vr2, Vr3, Vr4, Vr5, Vr6, and Vr7, of FIG. 5) or verify operation (e.g. verify target levels Vv1, Vv2, Vv3, Vv4, Vv5, Vv6, and Vv7 of FIG. 5) to determine whether a threshold voltage of the selected memory cell has reached such level.

In an embodiment, after an appropriate read or verify voltage is applied to a selected word line, a conduction current of the memory cell is measured to determine whether the memory cell turned ON (conducts current) in response to the voltage applied to the word line. If the conduction current is measured to be greater than a certain value, then it is assumed that the memory cell turned ON and the voltage applied to the word line is greater than the threshold voltage of the memory cell.

If the conduction current is measured to be not greater than the certain value, then the memory cell did not turn ON, and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate at which the memory cell discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether or not the bit line has been discharged. Note that the technology described herein can be used with different methods known in the art for verifying/reading. Other read and verify techniques known in the art also can be used.

As described above, at step 804 a program pulse is applied to the selected word line, and at step 806 memory cells coupled to the selected word line are verified using an appropriate set of verify reference voltages to perform one or more verify operations. Steps 804 and 806 are part of an iterative loop in which program pulses are applied as a series of program pulses that step up in magnitude, with intervening verify reference pulses between consecutive program pulses. Such an iterative loop is referred to herein as a "program-verify iteration."

Figure 9:
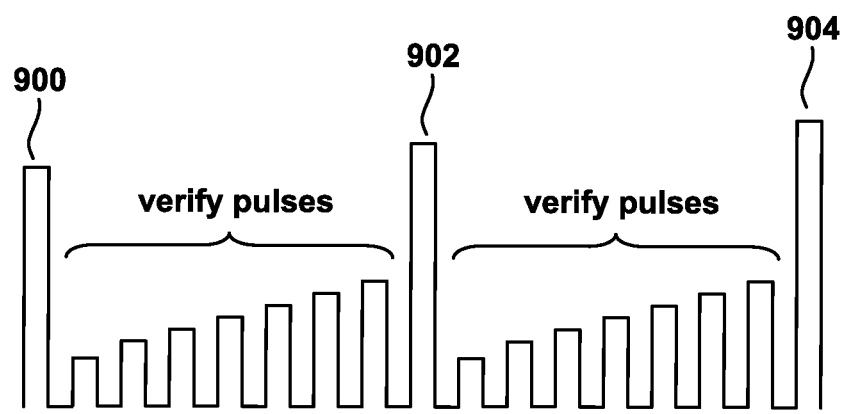
FIG. 9 depicts a word line voltage during programming and verify operations.

FIG. 9 illustrates an example of such program-verify pulses applied to a selected word line. In particular, FIG. 9 depicts program pulses 900, 902 and 904 applied to the selected word line during three successive iterations of step 804 of FIG. 8. Between program pulses 900, 902 and 904 verify pulses are applied to the selected word line during three successive program-verify iterations of steps 804-806 of FIG. 8 to determine whether threshold voltages of the memory cells are greater than the respective verify reference voltages.

As described above, in embodiments a population of memory cells to be programmed is first erased so that all memory cells in the population are in an erased data state (e.g., state S0 in FIG. 5 or state E in FIG. 7A) prior to programming. When the programmed memory cells are subsequently selected to be re-programmed, the memory cells are again erased prior to programming.

Each program and erase iteration of a memory cell or group of memory cells is referred to herein as a "program-erase cycle," and the number of program-erase cycles performed on a memory cell or group of memory cells is referred to herein as a "program-erase cycle count" or "PEC." In embodiments, a Controller Device maintains a record of the program-erase cycle count for each memory cell or group of memory cells of a memory structure (e.g., memory structure 202 of FIG. 2A).

An erase operation for memory cells in a block typically involves one or more "erase-verify iterations," also referred to as "erase-verify loops," where each iteration involves channel boosting followed by an erase verify test, until the erase operation is completed.

In an embodiment of an erase-verify loop, the voltages of the channels are boosted while holding the voltages of the word lines at a low level (e.g., at or close to 0 V). The channels are boosted by applying an erase pulse to the block. In one technique, the erase pulses are applied to the substrate, causing holes to be injected into the channels via the source ends of the NAND strings.

In another technique, the channels are boosted by generating holes at the source end and/or drain end of the NAND strings using gate-induced drain leakage (GIDL). Boosting the channels creates a large channel-to-gate voltage which drives holes into the charge trapping layers, lowering the threshold voltage of each memory cell.

An erase verify test, which is a sensing operation, can be performed after applying each erase pulse to determine if the threshold voltage of each memory cell has been lowered below an erase verify voltage. If the threshold voltage of a memory cell is below the erase verify voltage, the memory cell passes the erase verify test. If the threshold voltage of a memory cell is not below the erase verify voltage, the memory cell fails the erase verify test.

In embodiments, an erase operation for a block completes when fewer than a threshold number of memory cells in the block fail the erase verify test. As used herein, the threshold number is also called a "fail bits threshold number." The fail bits threshold number is sometimes referred to as a "bitscan pass/fail" or "BSPF" value. In an embodiment, the fail bits threshold number BSPF is the number of bits that can be corrected by error correction codes (ECC) during a read process for the page of memory cells. In other embodiments, other criteria may be used for specifying the fail bits threshold number BSPF. In an embodiment, the fail bits threshold number BSPF has a fixed value. For example, the fail bits threshold number BSPF=25, or some other value.

In embodiment, an erase operation for a block must complete within a maximum number of erase-verify loops ($EV_M$). For example, the maximum number of erase-verify loops $EV_M$ may be 6, or some other value. A block erase failure occurs if more than the fail bits threshold number BSPF of memory cells in the block fail erase verify tests within the maximum number of erase-verify loops $EV_M$. For example, if the fail bits threshold number BSPF=25 and the maximum number of erase-verify loops $EV_M$=6, a block erase failure may occur if more than 25 memory cells in the block fail erase verify tests within 6 erase-verify loops.

Figure 10:
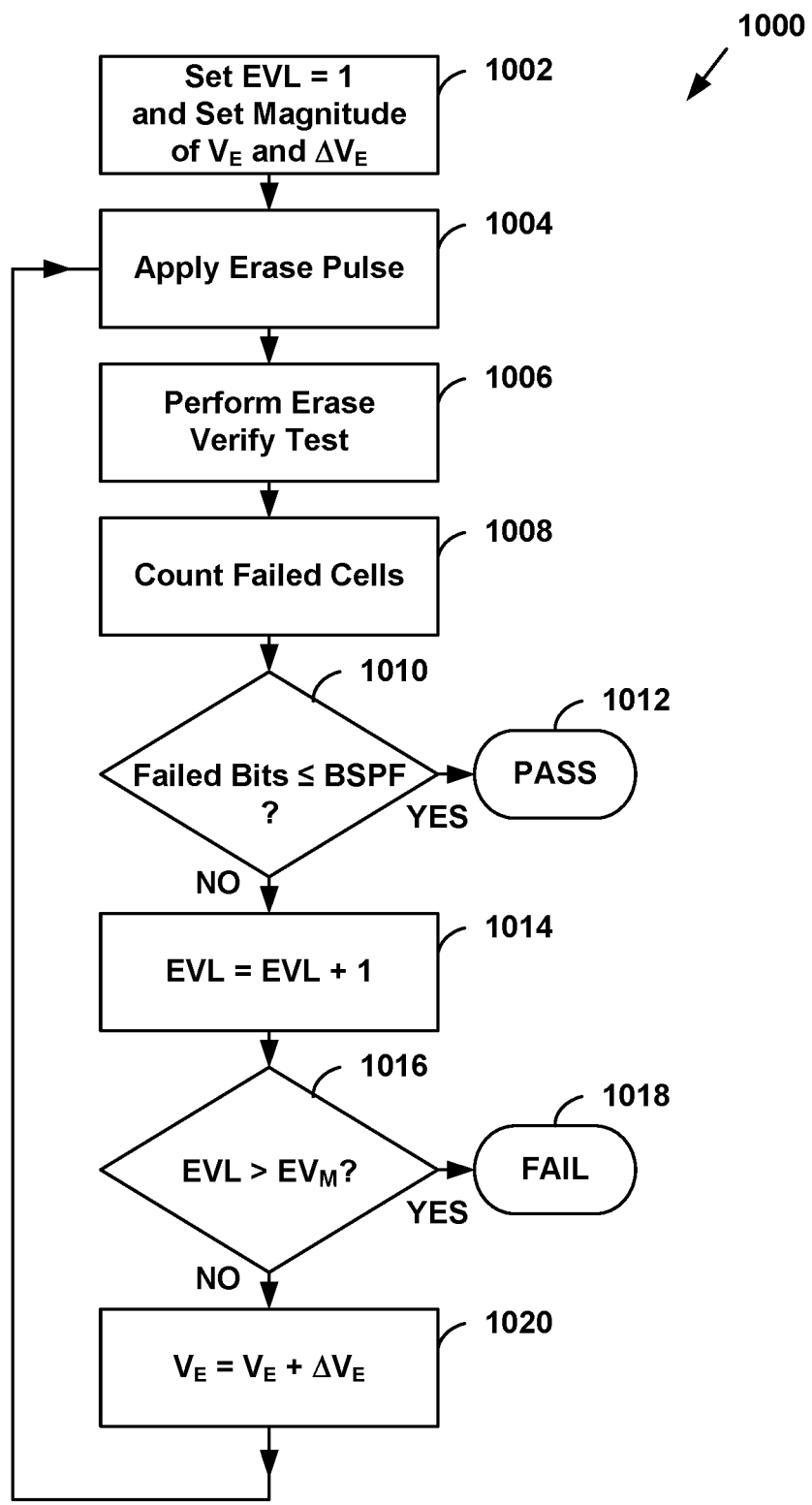
FIG. 10 depicts a flowchart describing an embodiment of a process for erasing a population of memory cells.

FIG. 10 is a flowchart describing an embodiment of a process 1000 for erasing a population of memory cells (e.g., an erase block of memory cells). In an example embodiment, process 1000 is performed on memory die 106 (FIG. 1) using the control circuits discussed above. For example, process 1000 can be performed at the direction of state machine 216 (FIG. 2).

In an embodiment, state machine 216 maintains as erase-verify loop counter EVL for the block of memory cells in process 1000. In step 1002, erase-verify loop counter EVL is initialized at 1, an erase voltage ($V_E$) is initialized to a starting erase voltage $V_{Einit}$ (e.g., between about 12V to about 16V, or some other value), and an erase voltage step AVE is set (e.g., 0.2V or some other value).

At step 1004, an erase pulse having a magnitude $V_E$ is applied to the memory cells of the erase block. At step 1006, an erase verify test is performed on the memory cells of the erase block, such as described above.

At step 1008, the memory system counts the number of memory cells in the erase block that have failed the erase verify test. That is, the system counts the number of memory cells in the erase block that have threshold voltages that are not below the erase verify voltage. This counting can be done by state machine 216 (FIG. 2), controller 104 (FIG. 1), or other logic.

At step 1010, a determination is made whether the count from step 1008 is less than or equal to fail bits threshold number BSPF. If a determination is made at step 1010 that the count at step 1008 is less than or equal to fail bits threshold number BSPF, then at step 1012 erase process 1000 is deemed to have passed.

In contrast, if at step 1010 a determination is made that the count at step 1008 is not less than or equal to fail bits threshold number BSPF, then at step 1014 erase-verify loop counter EVL is incremented by 1.

At step 1016, a determination is made whether erase-verify loop counter EVL is greater than the maximum number of erase-verify loops $EV_M$. If erase-verify loop counter EVL is greater than the maximum number of erase-verify loops $EV_M$, then at step 1018 erase process 1000 is deemed to have failed. In other words, within the maximum number of erase-verify loops $EV_M$ more than the fail bits threshold number BSPF of memory cells in the erase block fail erase verify tests, and the erase is deemed to have failed.

In contrast, if a determination is made that erase-verify loop counter EVL is less than or equal to the maximum number of erase-verify loops $EV_M$, at step 1020 erase voltage $V_E$ is incremented by erase voltage step AVE. Process 1000 then loops back to step 1004 and another erase pulse is applied to the memory cells of the erase block.

Thus, each pass through steps 1004-1010 is an example of an erase-verify loop. The loop of steps 1004-1020 is repeated until the number of memory cells in the erase block that have failed the erase verify test is less than or equal to fail bits threshold number BSPF (whereby the erase operation passes), or the erase-verify loop counter EVL is greater than the maximum number of erase-verify loops $EV_M$ (whereby the erase operation fails).

In process 1000, if at step 1010 a determination is made that the count at step 1008 is less than or equal to fail bits threshold number BSPF then the value of erase-verify loop counter EVL is the number of erase-verify loops required for the erase block to pass the erase verify test of step 1006.

An indication of the time required complete a memory cell erase operation is referred to herein as erase speed, and is described in terms of a number of erase-verify loops required for the memory cell to pass an erase verify test. For example, a first memory cell may pass an erase verify test in 2 erase-verify loops, and a second memory cell may pass the erase verify test in 6 erase-verify loops. In this context, the second memory cell may be said to have a slower erase speed than the first memory cell because the second memory cell requires more erase-verify loops to pass the erase verify test.

As described above, significant advances in memory technology have resulted from steadily reducing the physical dimensions of memory cells, which in turn can be packed more densely on a given die area. Doing so, however, may result in a greater number of manufacturing defects, such as shorting between signal lines and other components (such as shorting between adjacent word lines, shorting between bit lines and interconnects, shorting between word lines and the substrate) as well as broken word lines.

In many instances, such manufacturing defects do not affect performance of the memory system until the memory system has been used for one or more program-erase cycles, and may only begin to corrupt data after an end user begins programming and erasing memory cells in such memory devices. One instance in which such latent manufacturing defects may surface is during a multi-plane erase operation in which a memory structure is divided into multiple planes, and memory cells in the multiple planes are concurrently erased.

Figure 11:
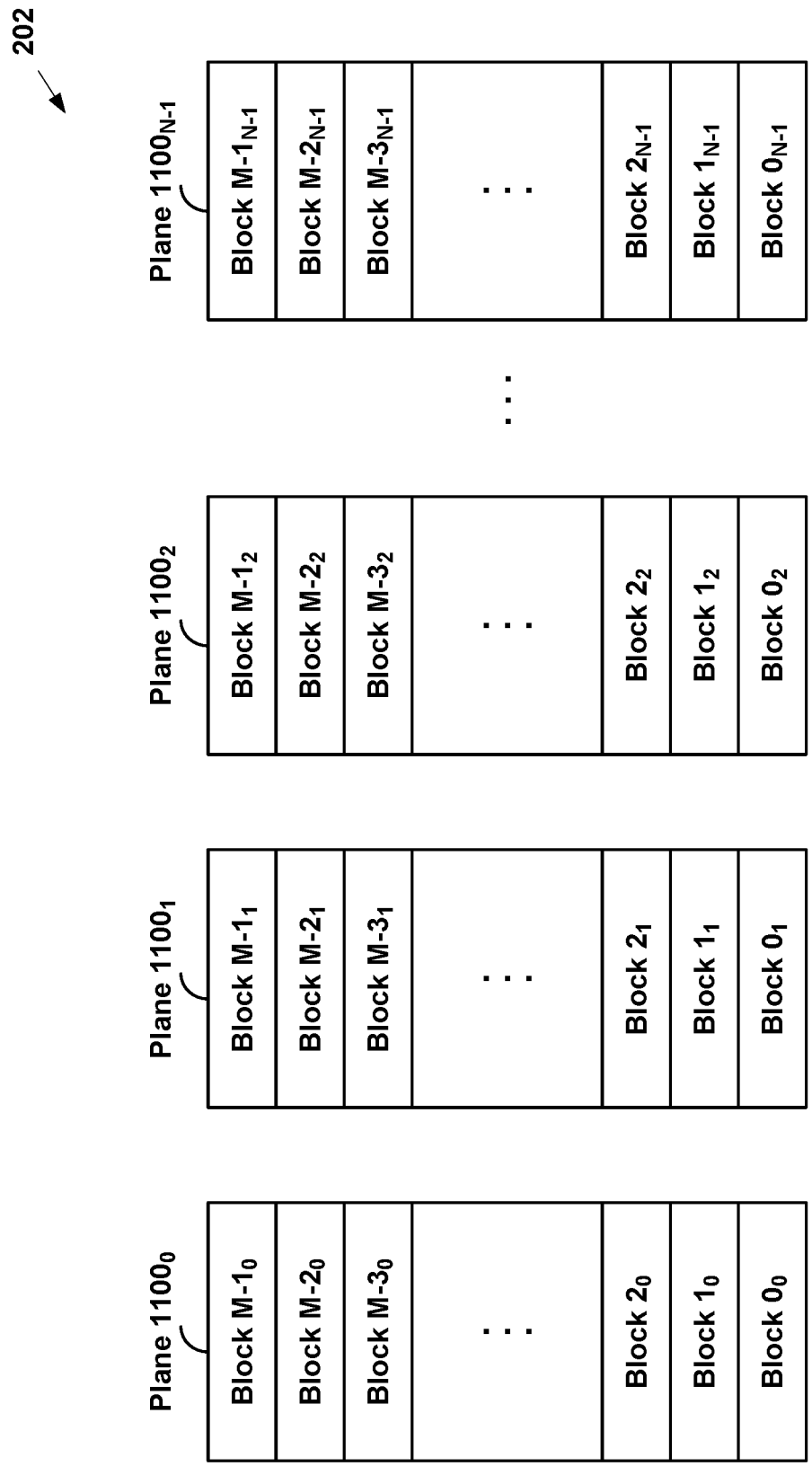
FIG. 11 is a block diagram of a memory structure having multiple planes.

FIG. 11 is a block diagram depicting an embodiment of a simplified multi-plane organization of memory structure 202 (FIG. 2), which is divided into N planes: a first plane $1100_0$, a second plane $1100_1$, a third plane $1100_2$ . . . , and an $N-1^{st}$ plane $1100_{N-1}$, all located on the same memory die 200 (FIG. 2). In an embodiment, each plane is divided into M blocks. For example, first plane $1100_0$ is divided into blocks Block $0_0$, Block $1_0$, . . . , Block $M-1_0$, second plane $1100_1$ is divided into blocks Block $0_1$, Block $1_1$, . . . , Block $M-1_1$, and so on.

In an embodiment, each plane has about 2000 blocks (e.g., N≈2000), although more or fewer blocks may be used. In an embodiment, a block of memory cells is a unit of erase. That is, all memory cells of a block are erased together. In some embodiments, a block represents a group of connected memory cells as the memory cells of a block share a common set of word lines.

In an embodiment of a multi-plane erase operation, one or more erase pulses are applied to memory cells in one or more blocks in each of first plane $1100_0$, second plane $1100_1$, third plane $1100_2$, . . . , and $N-1^{st}$ plane $1100_{N-1}$. For example, one or more erase pulses may be applied to memory cells in blocks Block $0_0$, Block $0_1$, Block $0_2$, . . . , Block $0_{N-1}$ in first plane $1100_0$, second plane $1100_1$, third plane $1100_2$, . . . , and $N-1^{st}$ plane $1100_{N-1}$, respectively.

While performing a multi-plane erase operation, an erase failure may occur on one or more of first plane $1100_0$, second plane $1100_1$, third plane $1100_2$, . . . , and N–$1^{st}$ plane $1100_{N-1}$. For example (referring to FIG. 10 step 1016), if erase-verify loop counter EVL may exceeds the maximum number of erase-verify loops $EV_M$ the erase is deemed to have failed. Although the test at step 1016 can determine that an erase failure has occurred, during a multi-plane erase step 1016 alone cannot determine which block or blocks of first plane $1100_0$, second plane $1100_1$, third plane $1100_2$, . . . , and N–$1^{st}$ plane $1100_{N-1}$ caused the erase failure.

In an embodiment, one technique for responding to an erase failure during a multi-plane erase, is to designate all blocks that are being erased as "bad blocks." Thus, continuing the example from above, in such an embodiment if an erase failure was detected while performing the multi-plane erase, then blocks Block $0_0$, Block $0_1$, Block $0_2$, . . . , Block $0_{N-1}$ are all marked as bad blocks.

A disadvantage of such a technique is that if only one of blocks Block $0_0$, Block $0_1$, Block $0_2$, . . . , Block $0_{N-1}$ are defective, all of blocks Block $0_0$, Block $0_1$, Block $0_2$, . . . , Block $0_{N-1}$ are nevertheless marked as bad blocks. Although this technique is straightforward and fast, the result is that numerous good blocks may unnecessarily be designated as bad blocks and thus waste resources. This problem is particularly significant as the number of planes being concurrently erased increases. For example, if a multiplane erase is performed on N=2000 planes and one block on one of the planes has a defect that causes an erase failure, 1999 otherwise good blocks are designated as bad blocks.

Figure 12:
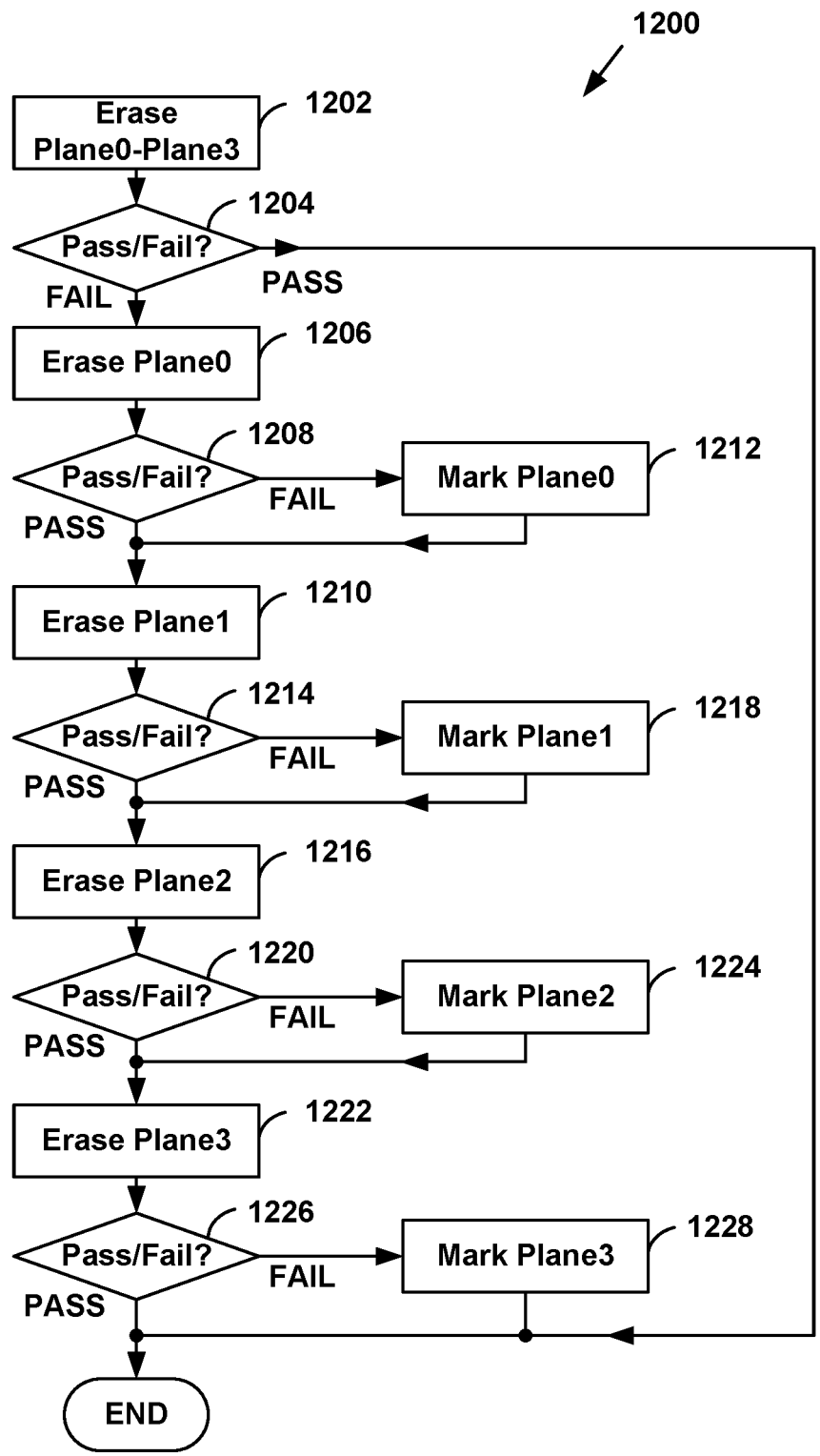
FIG. 12 is a flowchart describing an embodiment of a process 1200 for performing a multi-plane erase.

An alternative multi-plane erase technique does not mark all blocks as bad blocks. For example, FIG. 12 is a flowchart describing an embodiment of a process 1200 for performing a multi-plane erase. In an example embodiment, process 1200 is performed on memory die 106 (FIG. 1) using the control circuits discussed above. For example, process 1200 can be performed at the direction of state machine 216 (FIG. 2).

To simplify the following description, process 1200 describes a four-plane multi-plane erase on planes Plane0, Plane1, Plane2 and Plane3. Persons of ordinary skill in the art will understand that process 1200 also may be modified to apply to more or fewer than four planes.

At step 1202, a four-plane erase operation is performed on Plane0, Plane1, Plane2 and Plane3. For example, one or more blocks on each of Plane0, Plane1, Plane2 and Plane3 are concurrently erase, such as described above.

At step 1204, a determination is made whether the four-plane erase passed. If at step 1204 a determination is made that the four-plane erase passed, process 1200 ends.

If, however, a determination is made at step 1204 that the four-plane erase failed, then at step 1206 process 1200 switches to a single plane erase of Plane0. For example, one or more blocks on Plane0 are erased in single-plane erase mode.

At step 1208, a determination is made whether the single-plane erase of Plane0 passed. If a determination is made at step 1208 that the single-plane erase of Plane0 passed, at step 1210 one or more blocks on Plane1 are erased in single-plane erase mode.

If, however, a determination is made at step 1208 that the single-plane erase of Plane0 failed, then at step 1212 the one or more blocks of Plane0 are marked as bad blocks. Process 1200 then proceeds to step 1210 and one or more blocks on Plane1 are erased in single-plane erase mode.

At step 1214, a determination is made whether the single-plane erase of Plane1 passed. If a determination is made at step 1214 that the single-plane erase of Plane1 passed, at step 1216 one or more blocks on Plane2 are erased in single-plane erase mode.

If, however, a determination is made at step 1214 that the single-plane erase of Plane1 failed, then at step 1218 the one or more blocks of Plane1 are marked as bad blocks. Process 1200 then proceeds to step 1216 and one or more blocks on Plane2 are erased in single-plane erase mode.

At step 1220, a determination is made whether the single-plane erase of Plane2 passed. If a determination is made at step 1220 that the single-plane erase of Plane2 passed, at step 1222 one or more blocks on Plane3 are erased in single-plane erase mode.

If, however, a determination is made at step 1220 that the single-plane erase of Plane2 failed, then at step 1224 the one or more blocks of Plane2 are marked as bad blocks. Process 1200 then proceeds to step 1222 and one or more blocks on Plane3 are erased in single-plane erase mode.

At step 1226, a determination is made whether the single-plane erase of Plane3 passed. If a determination is made at step 1226 that the single-plane erase of Plane3 passed, process 1200 ends.

If, however, a determination is made at step 1226 that the single-plane erase of Plane3 failed, then at step 1228 the one or more blocks of Plane3 are marked as bad blocks. Process 1200 then ends.

An advantage of process 1200 is that a multi-plane erase failure does not mark all blocks being concurrently erased as bad blocks solely based on the multi-plane erase failure.

The time required to perform process 1200 depends on the number of single-plane erase failures. For example, assume an erase operation takes 3 msec (pass) and 6 msec (fail). Persons of ordinary skill in the art will understand that fail and pass erase times may have other values. In any scenario in which at least one of the planes fails, the time to complete steps 1202 and 1204 (fail) is 6 msec. The additional time to perform steps 1206-1228 is referred to herein as "penalty time." Table 1 below list example penalty times for process 1200 based on the number of failed planes:

TABLE 1

| Number of Failed Planes | Penalty Time |
| --- | --- |
| 1 | 6 msec (1 plane fail) + 3 × 3 msec (3 plane pass) = 15 msec |
| 2 | 2 × 6 msec (2 plane fails) + 2 × 3 msec (2 plane pass) = 18 msec |
| 3 | 3 × 6 msec (3 plane fails) + 1 × 3 msec (1 plane pass) = 21 msec |
| 4 | 4 × 6 msec (4 plane fails) + 0 × 3 msec (0 plane pass) = 24 msec |

These example penalty times are for a relatively simple case in which only four planes are used. As the number of planes increases, a multi-plane erase penalty time of process 1200 may become quite substantial. For example, a 2000 plane multi-plane erase with 2000 failed planes would have a penalty time of 2000×6 msec=12 seconds.

Figure 13:
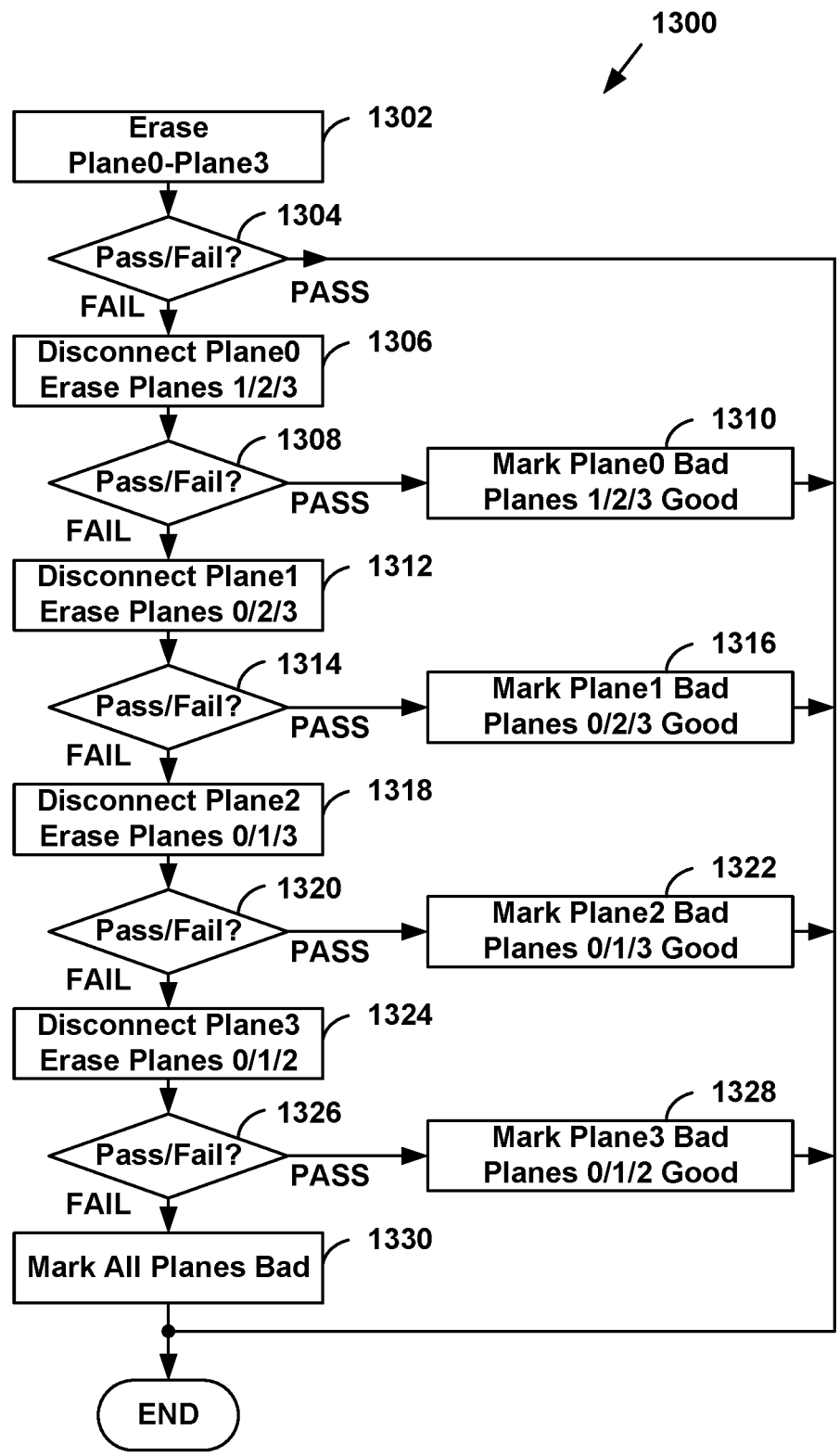
FIG. 13 is a flowchart describing an embodiment of a process 1300 for performing a multi-plane erase.

Technology is described that may reduce the multi-plane erase penalty times. For example, FIG. 13 is a flowchart describing an embodiment of a process 1300 for performing a "disconnect method" multi-plane erase. In an example embodiment, process 1300 is performed on memory die 106 (FIG. 1) using the control circuits discussed above. For example, process 1300 can be performed at the direction of state machine 216 (FIG. 2).

To simplify the following description, process 1300 describes a four-plane multi-plane erase on planes Plane0, Plane1, Plane2 and Plane3. Persons of ordinary skill in the art will understand that process 1300 also may be modified to apply to more or fewer than four planes.

At step 1302, a four-plane erase operation is performed on Plane0, Plane1, Plane2 and Plane3. For example, one or more blocks on each of Plane0, Plane1, Plane2 and Plane3 are concurrently erase, such as described above.

At step 1304, a determination is made whether the four-plane erase passed. If at step 1304 a determination is made that the four-plane erase passed, process 1300 ends.

If, however, at step 1304 a determination is made that the four-plane erase failed, at step 1306 a first one of the planes (Plane0) is disconnected from the other planes to form first remaining planes (Plane1, Plane2 and Plane3) (a first plurality of planes), and a multi-plane erase is performed on the first remaining planes. That is, process 1300 does not switch from multi-plane erase to single-plane erase.

At step 1308, a determination is made whether the multi-plane erase of step 1306 passed. If at step 1308 a determination is made that the multi-plane erase of step 1306 passed, at step 1310 the one or more blocks of Plane0 are marked as bad, the one or more blocks of Plane1, Plane2 and Plane3 are considered good, and process 1300 ends.

If, however, at step 1308 a determination is made that the multi-plane erase of step 1306 failed, at step 1312 the first one of the planes (Plane0) is reconnected to the first remaining planes, a second one of the planes (Plane1) is disconnected from the other planes to form second remaining planes (Plane0, Plane2 and Plane3) (a second plurality of planes), and a multi-plane erase is performed on the second remaining planes. That is, process 1300 does not switch from multi-plane erase to single-plane erase.

At step 1314, a determination is made whether the multi-plane erase of step 1312 passed. If at step 1314 a determination is made that the multi-plane erase of step 1312 passed, at step 1316 the one or more blocks of Plane1 are marked as bad, the one or more blocks of Plane0, Plane2 and Plane3 are considered good, and process 1300 ends.

If, however, at step 1314 a determination is made that the multi-plane erase of step 1312 failed, at step 1318 the second one of the planes (Plane1) is reconnected to the second remaining planes, a third one of the planes (Plane2) is disconnected from the other planes to form third remaining planes (Plane0, Plane1 and Plane3) (a third plurality of planes), and a multi-plane erase is performed on the third remaining planes. That is, process 1300 does not switch from multi-plane erase to single-plane erase.

At step 1320, a determination is made whether the multi-plane erase of step 1318 passed. If at step 1320 a determination is made that the multi-plane erase of step 1318 passed, at step 1322 the one or more blocks of Plane2 are marked as bad, the one or more blocks of Plane0, Plane1 and Plane3 are considered good, and process 1300 ends.

If, however, at step 1320 a determination is made that the multi-plane erase of step 1318 failed, at step 1324 the third one of the planes (Plane2) is reconnected to the third remaining planes, a fourth one of the planes (Plane3) is disconnected from the other planes to form fourth remaining planes (Plane0, Plane1 and Plane2) (a fourth plurality of planes), and a multi-plane erase is performed on the fourth remaining planes. That is, process 1300 does not switch from multi-plane erase to single-plane erase.

At step 1326, a determination is made whether the multi-plane erase of step 1324 passed. If at step 1326 a determination is made that the multi-plane erase of step 1324 passed, at step 1328 the one or more blocks of Plane3 are marked as bad, the one or more blocks of Plane0, Plane1 and Plane2 are considered good, and process 1300 ends.

If, however, at step 1326 a determination is made that the multi-plane erase of step 1324 failed, at step 1330 the one or more blocks of Plane0, Plane1, Plane2 and Plane3 are marked as bad, and process 1300 ends.

In the example process 1300 depicted in FIG. 13, planes are disconnected in sequential order (e.g., Plane0, Plane1, Plane2, Plane3). In other embodiments, the planes may be disconnected in other than sequential order (e.g., Plane2, Plane1, Plane3, Plane0).

The time required to perform process 1300 depends on the number of multi-plane erase failures. For example, assume an erase operation takes 3 msec (pass) and 6 msec (fail). Persons of ordinary skill in the art will understand that fail and pass erase times may have other values. In any scenario in which at least one of the planes fails, the time to complete steps 1302 and 1304 (fail) is 6 msec. The additional time to perform steps 1306-1330 is penalty time. Table 2 below list example penalty times for process 1300 based on the failed plane:

TABLE 2

| Failed Plane | Penalty Time |
| --- | --- |
| 0 | 3 msec (with Plane0 disconnected) = 3 msec |
| 1 | 6 msec (with Plane0 disconnected) + 3 msec (with Plane1 disconnected) = 9 msec |
| 2 | 6 msec (with Plane0 disconnected) + 6 msec (with Plane1 disconnected) + 3 msec (with Plane2 disconnected) = 15 msec |
| 3 | 6 msec (with Plane0 disconnected) + 6 msec (with Plane1 disconnected) + 6 msec (with Plane2 disconnected) + 3 msec (with Plane3 disconnected) = 21 msec |

Thus, compared to the penalty times of Table 1 for process 1200, the penalty times of Table 2 for process 1300 are smaller. In addition, depending on which plane failed and the number of planes concurrently erased, the differences in penalty times can be quite substantial. For example, if Plane0 failed, and the number of concurrently erased planes N=2000, the penalty time for process 1200 of FIG. 12 is 6 msec (1 plane fail)+1999×3 msec (1999 plane pass)=6.003 sec. In contrast, the penalty time for process 1300 of FIG. 13 is 3 msec.

In an embodiment, to reduce the amount of penalty time incurred during multi-plane erase, planes that have a higher tendency to have failed erase blocks may be disconnected earlier in process 1300.

Without wanting to be bound by any particular theory, it is believed that the disconnect method of process 1300 may reduce the time required to perform multi-plane erase operations.

One embodiment includes an apparatus that includes a control circuit coupled to a plurality of non-volatile memory cells disposed in a plurality of planes. The control circuit is configured to concurrently erase a block of memory cells in each of the plurality of planes, determine that the concurrent erase failed, disconnect a first one of the planes from the plurality of planes to form first remaining planes, and concurrently erase a block of memory cells in each of the first remaining planes.

One embodiment includes a method including concurrently erasing a block of memory cells in each of a plurality of planes of memory cells, determining that the concurrent erase failed, selectively disconnecting one of the planes from the plurality of planes to form a first plurality of planes, and concurrently erasing a block of memory cells in each of the first plurality of planes.

One embodiment includes an apparatus that includes a control circuit coupled to a plurality of non-volatile memory cells disposed in a plurality of planes. The control circuit is configured to concurrently erase a block of memory cells in each of the plurality of planes, determine that the concurrent erase failed, sequentially disconnect each of the planes from the plurality of planes to form a plurality of remaining planes, and concurrently erase a block of memory cells in each of the plurality of remaining planes.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
a control circuit coupled to a plurality of non-volatile memory cells disposed in a plurality of planes, the control circuit configured to:
concurrently erase a block of memory cells in each of the plurality of planes;
determine that the concurrent erase failed;
disconnect a first one of the planes from the plurality of planes to form first remaining planes; and
concurrently erase a block of memory cells in each of the first remaining planes.

2. The apparatus of claim 1, wherein the control circuit is further configured to:
determine that the concurrent erase on the first remaining planes passed; and
mark the block of memory cells in the first one of the planes as a bad block.

3. The apparatus of claim 2, wherein the control circuit is further configured to determine that the blocks of memory cells in each of the first remaining planes are good blocks.

4. The apparatus of claim 1, wherein the control circuit is further configured to:
determine that the concurrent erase on the first remaining planes failed;
reconnect the first one of the planes to the first remaining planes;
disconnect a second one of the planes from the plurality of planes to form second remaining planes; and
concurrently erase a block of memory cells in each of the second remaining planes.

5. The apparatus of claim 4, wherein the control circuit is further configured to:
determine that the concurrent erase on the second remaining planes passed; and
mark the block of memory cells in the second one of the planes as a bad block.

6. The apparatus of claim 5, wherein the control circuit is further configured to determine that the blocks of memory cells in each of the second remaining planes are good blocks.

7. The apparatus of claim 4, wherein the control circuit is further configured to:
determine that the concurrent erase on the second remaining planes failed;
reconnect the second one of the planes to the second remaining planes;
disconnect a third one of the planes from the plurality of planes to form third remaining planes; and
concurrently erase a block of memory cells in each of the third remaining planes.

8. The apparatus of claim 7, wherein the control circuit is further configured to:
determine that the concurrent erase on the third remaining planes passed; and
mark the block of memory cells in the third one of the planes as a bad block.

9. The apparatus of claim 8, wherein the control circuit is further configured to determine that the blocks of memory cells in each of the third remaining planes are good blocks.

10. The apparatus of claim 7, wherein the control circuit is further configured to:
determine that the concurrent erase on the third remaining planes failed;
reconnect the third one of the planes to the third remaining planes;
disconnect a fourth one of the planes from the plurality of planes to form fourth remaining planes; and
concurrently erase a block of memory cells in each of the fourth remaining planes.

11. The apparatus of claim 10, wherein the control circuit is further configured to:
determine that the concurrent erase on the fourth remaining planes passed; and
mark the block of memory cells in the fourth one of the planes as a bad block.

12. The apparatus of claim 11, wherein the control circuit is further configured to determine that the blocks of memory cells in each of the fourth remaining planes are good blocks.

13. The apparatus of claim 10, wherein the control circuit is further configured to:
determine that the concurrent erase on the fourth remaining planes failed; and
mark the blocks in each of the plurality of planes as bad blocks.

14. The apparatus of claim 1, wherein the control circuit is further configured to:
   determine that the concurrent erase on the first remaining planes failed; and
   not switch to a single plane erase mode on any of the plurality of planes.

15. A method comprising:
   concurrently erasing a block of memory cells in each of a plurality of planes of memory cells;
   determining that the concurrent erase failed;
   selectively disconnecting one of the planes from the plurality of planes to form a first plurality of planes; and
   concurrently erasing a block of memory cells in each of the first plurality of planes.

16. The method of claim 15, further comprising:
   determining that the concurrent erase on the first plurality of planes passed; and
   mark the block of memory cells in the one of the planes as a bad block.

17. The method of claim 16, further comprising determining that the blocks of memory cells in each of the first plurality of planes are good blocks.

18. The method of claim 15, further comprising:
   determining that the concurrent erase on the first plurality of planes failed;
   reconnect the one of the planes to the first plurality of planes;
   selectively disconnecting a second one of the planes from the plurality of planes to form a second plurality of planes; and
   concurrently erasing a block of memory cells in each of the second plurality of planes.

19. An apparatus comprising:
   a control circuit coupled to a plurality of non-volatile memory cells disposed in a plurality of planes, the control circuit configured to:
   concurrently erase a block of memory cells in each of the plurality of planes;
   determine that the concurrent erase failed;
   sequentially disconnect each of the planes from the plurality of planes to form a plurality of remaining planes; and
   concurrently erase a block of memory cells in each of the plurality of remaining planes.

20. The apparatus of claim 19, wherein the control circuit is further configured to not switch to a single plane erase mode on any of the plurality of planes.

* * * * *